United States Patent [19]

Shimizu et al.

[11] Patent Number: 5,892,706
[45] Date of Patent: Apr. 6, 1999

[54] FRAM, FRAM CARD, AND CARD SYSTEM USING THE SAME

[75] Inventors: Mitsuru Shimizu, Kanagawa-ken; Sumio Tanaka, Tokyo, both of Japan

[73] Assignee: Kabushiki Kaisha Toshiba, Tokyo, Japan

[21] Appl. No.: 18,693

[22] Filed: Feb. 4, 1998

Related U.S. Application Data

[62] Division of Ser. No. 518,440, Aug. 23, 1995, Pat. No. 5,798,964.

[30] Foreign Application Priority Data

Aug. 29, 1994 [JP] Japan .............................. 203957/1994

[51] Int. Cl.$^6$ .................................................. G11C 11/22
[52] U.S. Cl. ............................ 365/145; 365/65; 365/226
[58] Field of Search .............................. 365/145, 65, 117, 365/149, 226

[56] References Cited

U.S. PATENT DOCUMENTS

| | | | |
|---|---|---|---|
| 4,344,155 | 8/1982 | Mollier ................................ 365/149 X |
| 4,873,664 | 10/1989 | Eaton, Jr. ................................ 365/145 |
| 5,430,671 | 7/1995 | Hirano et al. ............................ 365/145 |
| 5,504,699 | 4/1996 | Goller et al. ......................... 365/135 X |
| 5,515,312 | 5/1996 | Nakakuma et al. ..................... 365/145 |
| 5,615,144 | 3/1997 | Kimura et al. ........................... 365/145 |

OTHER PUBLICATIONS

S. Sheffield Easton, et al., "A Ferroelectric Nonvolatile Memory," Session X: Nonvolatile Memories, ISSCC Digest of Technical papers, pp. 130–131, Feb. 1988.

*Primary Examiner*—Do Hyun Yoo
*Attorney, Agent, or Firm*—Pillsbury Madison & Sutro LLP

[57] ABSTRACT

Circuitry within a ferroelectric memory prevents inversion of the polarization of ferroelectric memory cells caused by a power on reset signal to avoid corruption of data stored therein. A ferroelectric memory includes a memory cell array, a plurality of word lines commonly connected to the gates of the cell transistors in the same row, a plurality of plate lines commonly connected to the plates of the cell capacitors in the same row, a plurality of bit lines commonly connected to one end of the cell transistors in the same row, and a power on reset circuit for generating a power on reset signal of a predetermined level for a predetermined period of time after the power supply is turned on. An erroneous programming prevention circuit within the memory includes a plurality of switching transistors connected between all of the bit lines and plate lines and a plurality of nodes at a predetermined potential. The switching transistors are controlled by the power on reset signal so that they are on for a predetermined period of time.

5 Claims, 32 Drawing Sheets

| NAME OF MATERIALS | FORMULA | CURIE POINT (°C) | POLARIZABILITY (μC/cm²) | COERCIVE ELECTRIC FIELD (kV/cm) | RELATIVE DIELECTRIC CONSTANT |
|---|---|---|---|---|---|
| LEAD ZIRCONATE TITANATE (PZT) | $PbZrTiO_3$ | 387 | ~30 | ~20 | 1000 |
| BARIUM TITANATE (BTO) | $BaTiO_3$ | 130 | 26 | 1.2 | 1000 |
| STRONTIUM TITANATE (STO) | $SrTiO_3$ | −163 | — | — | 300 |

FIG. 3

Chip Enable Buffer Circuit

Precharge Signal Generation Circuit

Row Partial Decode Circuit

| XA0 | XA1 | XA2 | XA3 |
|-----|-----|-----|-----|
| /A3R | /A3R | A3R | A3R |
| A4R | /A4R | A4R | /A4R |

| XB0 | XB1 | XB2 | XB3 |
|-----|-----|-----|-----|
| /A5R | A5R | /A5R | A5R |
| A6R | A6R | /A6R | /A6R |

| XC0 | XC1 | XC2 | XC3 |
|-----|-----|-----|-----|
| /A7R | A7R | /A7R | A7R |
| A8R | A8R | /A8R | /A8R |

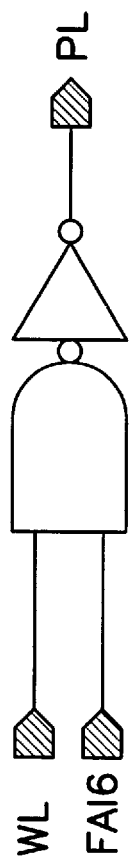

Equalize Circuit

Sense Amp Driver Circuit

Column Partial Decode Circuit (forA2C)

(forA0C, A1C)

| YA0 | YA1 | YA2 | YA3 |
|-----|------|------|------|
| A0C | /A0C | A0C | /A0C |
| A1C | A1C | /A1C | /A1C |

Data Line Buffer Circuit

Data Output Circuit

Data Input Circuit

FRAM, FRAM CARD, AND CARD SYSTEM USING THE SAME

This is a divisional of application Ser. No. 08/518,440, filed Aug. 23, 1995, now U.S. Pat. No. 5,798,964. The entire disclosure of prior application Ser. No. 08/518,440 is herein incorporated by reference.

FIELD OF THE INVENTION

The present invention relates to semiconductor memories. More particularly, the present invention relates to a ferroelectric memory having an array of memory cells wherein a ferroelectric substance is used as the insulation film of a capacitor for storing information within a memory cell, and to a circuit in a ferroelectric memory which prevents the corruption of data stored in ferroelectric memory cells at the time of a power on reset operation.

BACKGROUND OF THE INVENTION

Recently, research and development efforts have been directed to semiconductor memory devices utilizing ferroelectric memory cells in hopes of providing memories which are non-volatile and provide fast access. Examples of such semiconductor devices are described in U.S. Pat. No. 4,873,664 to Eaton, Jr. and in the article Eaton, Jr., et al., "A Ferroelectric DRAM Cell for High Density NVRAMs," ISSCC DIGEST OF TECHNICAL PAPERS, pp. 130–131, February 1988. Conventional examples of such devices, however, have experienced the corruption of data due to unknown causes. The observed failure mode is that data are corrupted when previously written data are inverted as a power supply is turned on which had previously been turned off.

SUMMARY OF THE PREFERRED EMBODIMENTS

It is an object of the present invention to provide a ferroelectric memory in which corruption of data stored therein due to the unintended inversion of polarization of the ferroelectric memory cells can be avoided, preferably by using a power on reset signal generated by a power on reset circuit.

A plurality of first switching transistors are controlled by a power on reset signal so that they are kept in an on state for a predetermined period of time when the power supply is turned on to set all bit lines to nodes at a predetermined potential. Thus, appropriate selection of the potential of the nodes will prevent the polarization of ferroelectric memory cells from being inverted, thereby eliminating the possibility of corruption of the data stored therein. Second switching transistors are connected between all plate lines and nodes at a predetermined potential so that all the plate lines are set to the nodes at a predetermined potential and are controlled to stay in an on state when power is turned on. As a result, the plate lines are set to the nodes at a predetermined potential. This make it possible to prevent the inversion of the polarization of the ferroelectric memory cells and the corruption of the data stored therein.

BRIEF DESCRIPTION OF THE DRAWINGS

FIG. 3 is a table illustrating selected properties of ferroelectric materials;

FIGS. 17A–C illustrate a configuration of a plate decode circuit and the operation of such a circuit;

DETAILED DESCRIPTION OF THE PREFERRED EMBODIMENTS

Figure 1:
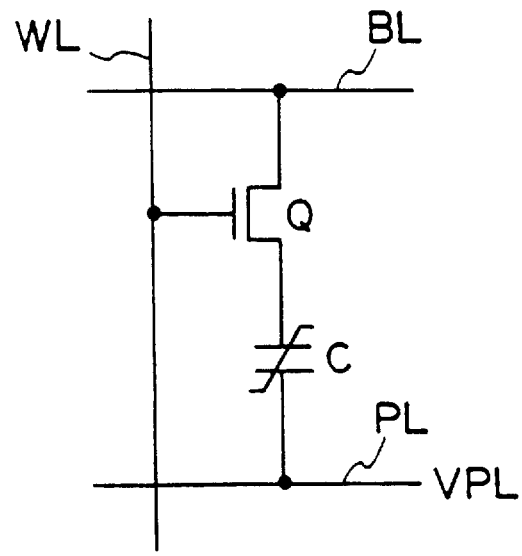
FIG. 1 is an equivalent circuit diagram for an FRAM cell.

A ferroelectric film is characterized in that electrical polarization induced in the film as a result of the application of an electrical field remains even after the electrical field is removed. The polarization of the ferroelectric film can be inverted when an electrical field of a strength exceeding a certain level is applied in the direction opposite to that of the electrical field applied to induce the original polarization. Based on the polarization characteristics of ferroelectric materials, a technique has been developed wherein a ferroelectric material is used for an insulation film of a capacitor for storing information in a memory cell as a part of a non-volatile ferroelectric memory device.

Application of a ferroelectric material to semiconductor integrated circuit devices, especially memory devices, provides the following effects:

1. non-volatility of data (or other signal);
2. high speed in writing and erasing data;
3. high resistance to radioactive errors or degradation; and
4. improved integration density.

Such effects originate from the nature of ferroelectric materials.

The non-volatility of data is attributable to the fact that binary data corresponding to positive and negative polarizations can be stored utilizing the hysteresis characteristics of the ferroelectric material and the induced polarization will remain even if there is no electrical field (E=0) present. FRAMs thus have the advantage over DRAMs that no refresh cycle is required to retain data, with all the inherent advantages of not needing to incorporate refresh circuitry or refresh timing and delays. FRAMs may also be more energy efficient than DRAMs and so may be better suited for some types of portable applications.

The high data write and read speeds achieved for FRAMs are attributable to the fact that the time required to invert the polarization of a ferroelectric material by applying an external voltage (switching speed) can be as little as one nanosecond, even when only low electrical fields are used in writing and reading data. The write and read speeds achieved for FRAMs represent an advantage over EEPROMs, which perform writing and erasing operations by means of injection and discharge of hot carriers through an insulation film under a high electrical field (on the order of $10^7$ V/cm), which operations may take more than one microsecond.

A conventional memory device accumulates electric charges within a capacitor and the quantity of the accumulated electric charges represents the information within a conventional memory. The stored information can thus be changed when alpha particles within the silicon substrate decay, annihilating one or more of the accumulated electric charges. This phenomenon creates soft errors and, together with other radiation-related soft error mechanisms, represents a serious problem for the reliability of devices intended for the field of aerospace technology. In the case of a memory device utilizing a ferroelectric material wherein information is accumulated in the form of the polarization exhibited by a crystal structure, incidence of radiation will not substantially alter the stored information. Thus, a memory utilizing a ferroelectric material has a higher resistance to radioactive errors than do many types of conventional memories.

The improvement in integration density associated with the use of ferroelectric materials within semiconductor devices will now be described. Recent memory devices, especially DRAMs, have been enlarged in scale and the level of integration of such memory devices has been enhanced at a high rate of approximately a factor of four in three years. This higher level of integration has been achieved by making the dimensions of structures within memory devices more microscopic. (Design rules have been changed to allow each generation of devices to have dimensions which are about 0.7 times those of the previous generation.) However, no substantial improvement has been achieved in the charge accumulation capacity of the devices, a fact which is closely related to the susceptibility of conventional memories to soft errors. Discussions have recently focused on memory cell structures which will provide a capacitor having a sufficient surface area (and thus providing sufficient charge accumulation capacity) while reducing the amount of "real estate" occupied by the capacitor, thereby reducing the area of the memory cell.

Two candidates for decreasing memory area while still providing sufficient charge accumulation are the stacked and the trench-type memory cells. Both stacked and trench-type memory cells are more complicated in their structures and in their manufacture as compared to planar cells. Specifically, stacked cells develop such large irregularities on their surfaces that it is difficult to maintain accuracy for fine processing above the stacked cell. This is especially true when an exposure technique is employed for photolithography, where a large focal depth is required to accomplish satisfactory processing above stacked cells. Formation of a trench type cell requires an etching technique for cutting a trench having a high aspect ratio and a technique for filling the trench. Finer formation processes for memories such as 256M DRAMs expected in the future will result in an increased need for more complicated processing techniques and device structures to maintain a sufficiently high storage capacitance within a small cell surface area. It will become increasingly difficult to supply devices having high reliability at low cost in large quantity. However, if a capacitor insulation film is formed from a ferroelectric material having a dielectric constant which is at least about 100 times that of a silicon oxide, it may be possible to maintain a large capacitance with a small surface area capacitor. This suggests a possibility that complicated processing techniques and cell structures could be avoided or that the use of such complicated techniques and structures could at least be delayed by incorporating ferroelectric layers as high dielectric constant insulating layers within memory cells.

As described above, the use of ferroelectric films in semiconductor devices will be important not only for non-volatile memory applications but also for applications usually associated with DRAMs.

FIG. 1 shows an equivalent circuit for a ferroelectric memory cell having a one-transistor/one-capacitor configuration. Connections between the ferroelectric memory cell and other circuit elements are the same as those typically provided for a DRAM cell. In FIG. 1, the letter C designates an information storage capacitor having a ferroelectric insulating layer, the polarization of which represents stored information. A ferroelectric material having a perovskite structure is preferably used for the insulation film between the electrodes of the capacitor. Q designates a MOS transistor for transferring charges connected in series with the capacitor; WL designates a word line connected to the gate of the MOS transistor; BL designates a bit line connected to one end of the MOS transistor; PL designates a plate line connected to one end (plate) of the capacitor; and VPL designates the voltage of the plate line.

Figure 2:
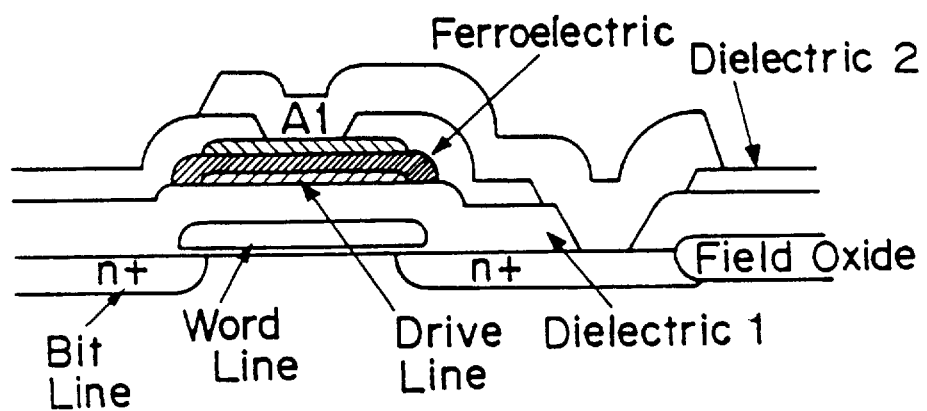
FIG. 2 is a sectional view of an FRAM cell.

Several operational modes have been proposed for the ferroelectric random access memory (FRAM). An operational mode utilizing a one-transistor/one-ferroelectric-capacity (1T/1C) cell is expected to become widely implemented in the future to reduce the cost of FRAM chips, much in the same way that such a memory cell has come to dominate DRAM design. FIG. 2 shows a sectional view of a ferroelectric memory cell, which has been fabricated using a 2 $\mu$m process in the illustrated example. The planar stacked cell structure shown is obtained by forming a layer of ferroelectric material within the FRAM cell using processes such as sputtering or other physical vapor deposition techniques that are similar to the processes used for forming metal layers. As a result, a problem of cross-contamination that may be encountered in conventional ferroelectric material forming processes can be avoided, making it possible to add a ferroelectric material forming process to a DRAM forming process. By adopting FRAM processing techniques that are compatible with DRAM processing, parallel development and initial production of FRAM's and DRAM's can be carried out using a prototype line for MOS VLSI's. This provides a significant advantage for the development of at least prototype FRAM devices in that little initial investment is required for the development of such an FRAM.

Deposition of a ferroelectric thin film on a silicon substrate or a polycrystalline silicon electrode often results in the formation of a $SiO_2$ (silicon oxide) film having a small dielectric constant at the interface between the underlying silicon and the overlayer of ferroelectric material. This deposition process can also introduce cross diffusion between the silicon and ferroelectric layers if the device is heated during deposition. It is very desirable to form a stable capacitor electrode between a silicon layer and the ferroelectric layer to be used as the insulating layer of the capacitor. A material for an electrode to be used for a ferroelectric thin film applied to silicon processing preferably has the following characteristics.

1. The electrode material should be resistant to oxidation. Alternatively, it may have a conductive oxide.

2. The electrode material should be well matched with a ferroelectric film (i.e., the material's crystalline properties should be similar to the properties of the ferroelectric film) and the electrode material should be easily processed.

3. The electrode material should not interdiffuse with silicon or PZT and thin films of the material should adhere well to a $SiO_2$ film.

Currently, platinum (Pt) is widely used as an electrode material for ferroelectric capacitors. Platinum is conductive, does not oxidize easily and platinum matches $PbTiO_3$ and PZT films well. However, platinum is difficult to process finely and cross diffuses with the silicon of the substrate at low temperatures to form platinum silicide. It is often desirable to form a barrier of titanium or the like at the interface between the platinum and the silicon substrate. Other appropriate electrode materials may include TiN and ZrN which are nitrides of transition metals and which have a high resistance to oxidation, similar to platinum. The preferred electrode structure currently consists of a silicon substrate, a lower layer electrode, a layer of a ferroelectric material, and an upper layer electrode. Preferred materials for the lower layer electrode are titanium, titanium nitride, and platinum, and the preferred materials for the upper layer electrode are platinum, titanium, and aluminum.

The specifications shown below are for a portion of a preferred FRAM processing flow for forming a ferroelectric information storage capacitor which is compatible with a DRAM processing flow.

1. Ti/TiN sputtering: 200/700 Å.
2. diffusion sintering (in $N_2+O_2$) at 600° C. for 30 minutes.
3. Pt sputtering to a thickness of 1000 Å.
4. plate electrode photo-engraving process (PEP).
5. RIE using ion milling.
6. PZT sputtering to a thickness of 1500–3000 Å.
7. thermal processing (in $N_2+O_2$) at 600° C. for 60 minutes.
8. dry etching (wet: $HF+H_2O_2$).
9. Pt sputtering to a thickness of 1000 Å.
10. upper electrode PEP.
11. RIE using ion milling.
12. p-$SiO_2$ deposition to a thickness of 3000 Å.
13. contact PEP:

metal forming process;

Ti/TiN sputtering: 200/700 Å;

diffusion sintering (in $N_2+O_2$) at 600° C. for 30 minutes;

Al sputtering;

RIE; and sintering (in forming gas) at 450° C. for 30 minutes.

FIG. 3 lists some of the available ferroelectric materials. PZT, BTO, and the like are preferable ferroelectric materials for use in memories in accordance with the present invention.

General requirements for the formation of a ferroelectric film include the following.

(1) The film should be a single phase layer having a desired percentage composition.

(2) The thin film preferably conforms to the underlying structure so that it adheres well to the substrate; typically a conforming thin film will have a smooth surface.

(3) The film should have a high density and no pin holes. The microscopic structure of the film is desirably uniform.

(4) The film should have good crystallinity and characteristics which are equivalent to or better than those of bulk materials.

(5) The film is preferably capable of being epitaxially grown on the substrate.

(6) Preferably, the thin film is formed at lower temperatures.

(7) It should be possible to easily control the thickness of the film.

The requirement mentioned in the above item (1) is important especially when the film is formed using a chemical vapor deposition (CVD) process. Since different elements enter a vapor phase in different processes and adhere to a film in different ratios, desired composition is pursued, in general, using a technique wherein parameters for film formation are changed based on an analysis made after formation of a film. With regard to the requirement of item (4), the crystallinity of a thin film tends to be poor because its crystal grain size is so microscopic, and the characteristics of a film such as the dielectric characteristic depend on the crystal grain size. To make suitable films, the microscopic structure of the film is desirably strictly controlled.

Figure 4:
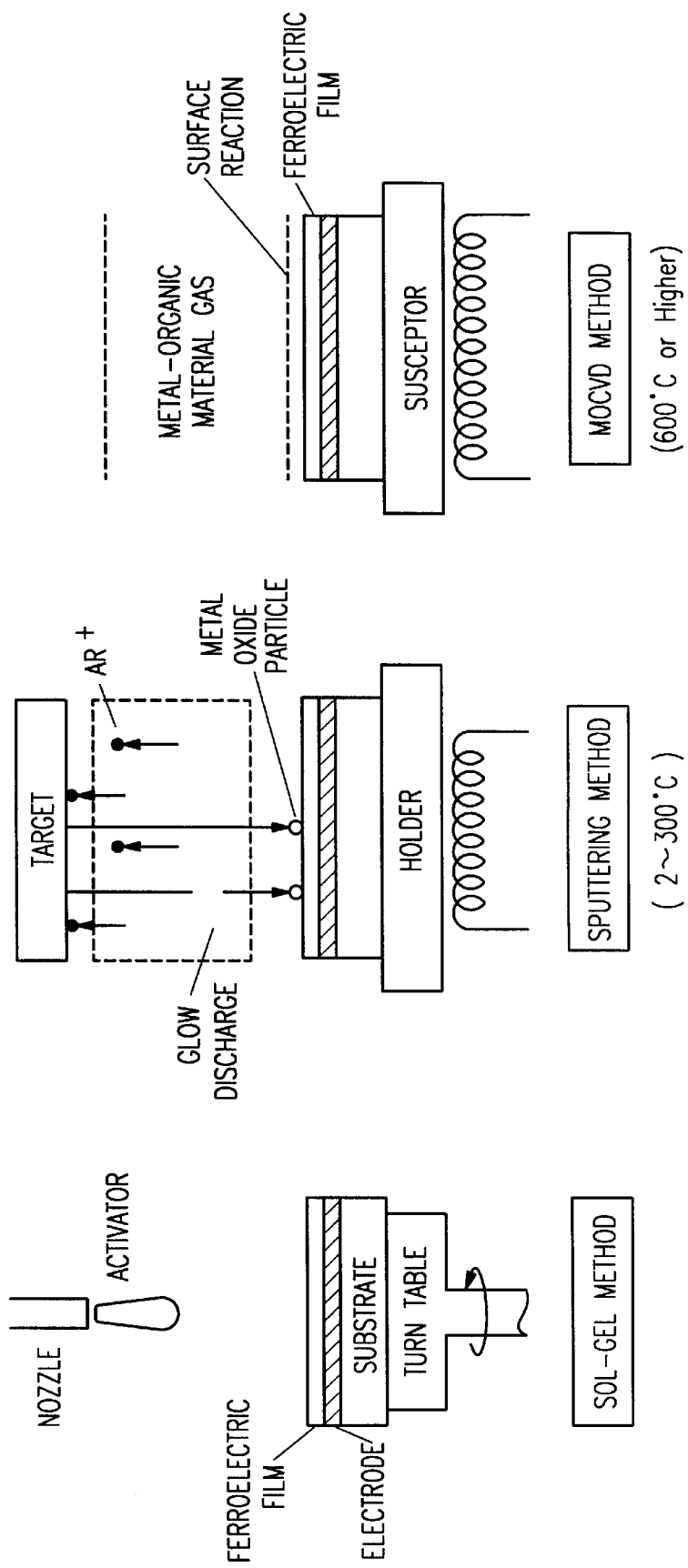
FIG. 4 illustrates methods of manufacturing a ferroelectric film.

There are three typical methods for forming a ferroelectric film used in a semiconductor device: the sol-gel method, sputtering method, and MOCVD method. These methods are illustrated in FIG. 4, and will be summarized below.

According to the sol-gel method, a precursor sol solution is prepared by hydrolysis and polycondensation of compounds in a solution obtained from a source material such as an organometallic compound; a gel film is formed on the substrate by dipping or spin coating; and the gel film is subjected to thermal decomposition to obtain a ferroelectric film. Although this method allows film formation in many different atmospheres and makes it easy to obtain films having large surface areas, it has a problem in that pin holes are frequently formed on the deposited film. Active research continues on the synthesis of improved ferroelectric films made of $BaTiO_3$, $PbTiO_3$, PZT, PLZT, etc., using the sol-gel method.

According to the sputtering method, a glow discharge is established so that ionized gas atoms (argon is commonly used) collide against a target made of a material to be formed into a thin film. Material is ejected from the target in response to the collisions and is then deposited on the substrate. This method allows formation of a film from a high melting point material which is difficult to achieve through any other vacuum deposition method. The sputtering method includes DC sputtering, radio frequency (RF) sputtering, magnetron sputtering, ion beam sputtering, reactive sputtering, and laser ablation.

For ferroelectric materials, radio frequency sputtering (RF) became popular in the 1970s, and a variety of ferroelectric films made of materials such as $BaTiO_3$, PZT, PLZT, $LiNbO_3$, and $K_3Li_2Nb_5O_{15}$ have been developed and evaluated with regard to their solid state properties. RF sputtering is performed in an argon/oxygen atmosphere using a sintered material or fine particles as a target. A component having a high vapor pressure such as lead is added to the target in an excess by a few percent to control the composition of the thin film. In some cases, a magnet is placed in the vicinity of the target so that sputtered ions are constrained by the magnetic field, allowing sputtering to occur at a low gas pressure ($10^{-4}$ Torr), thereby multiplying the film growth rate several times. The microscopic structure and characteristics of a thin film depend on the conditions under which it has been sputtered (sputtering voltage, the composition and pressure of the gas, the film growth rate, the composition of the substrate, the temperature of the substrate, etc.). In general, crystallinity is poor for a thin film which has been formed at a high speed and a low substrate temperature. Although the combination of high substrate temperatures and low film growth rates tends to provide a film having good crystallinity, there is typically an optimum temperature and growth rate to obtain a uniform crystalline film. Recently, high quality PZT thin films formed by laser ablation utilizing an excimer laser are believed to show promise for the future because of a reduced deviation between the desired composition and the actual film composition which can be formed under a relatively high oxygen pressure.

According to the CVD method, films are formed by introducing volatile compounds including the materials to be formed into a thin film into a furnace, decomposing the compounds and depositing the materials on the surface of a substrate. Since this allows film formation in equilibrium on the substrate surface, there is a possibility that a crystalline film of higher quality can be obtained. $BaTiO_3$ films and PZT films have been formed using the MOCVD method from metal-organic compounds having radicals such as acetylacetonate and alkoxide, although the characteristics of such films have not been evaluated in detail yet.

In a non-volatile memory, including FRAMs, fine processing steps (i.e., steps with demanding tolerances) must be performed on the capacitor of each memory cell after the capacitor insulation film is formed. Currently known techniques for performing such fine processing on ferroelectric films include wet etching, ion milling, ion beam etching, laser etching, and plasma etching. These processing techniques are applied to the typically used ferroelectric materials such as PZT (lead zirconate titanate) and PLZT (lead lanthanum zirconate titanate) in the formation of the insulative layers within the information storage capacitors in FRAMs.

Plasma etching is a process wherein, for example, a reactant which has been activated by high energy supplied by means of plasma discharge forms a reaction product having a high vapor pressure at the surface of the material being etched. Although the $TiO_2$ (titanate) and $ZrO_2$ (zirconate) components of a PZT film can be etched using a fluorine type gas, a PbO (lead oxide) component of the PZT cannot be etched satisfactorily at room temperature because it is difficult to form a fluoride or a chloride having a sufficiently high vapor pressure as to be effectively etched. However, it has been confirmed that PZT and PLZT films can be etched using a $CF_4$ plasma, if the films are heated. In this case, slow etching is observed when the substrate temperature is 200° C. or higher, with the observed etching rate being only about 2500 Å per hour at a substrate temperature of 300° C. The etching rate can be increased if HCl gas is mixed with the $CF_4$ gas. A plasma of $CF_4$ gas etches the titanium and lead based components of PZT faster, but does not etch the lanthanum based components of PLZT satisfactorily. For these lanthanum based components of PLZT, it is desirable to incorporate a plasma including HCl gas, because HCl gas reacts with lanthanum more easily than other elements. Optimization of the mixing ratio between those gases provides an etching rate of about 6500 Å per hour for either of PZT or PLZT films.

Having described the formation of FRAM cells, the operational principles of a two-transistor/two-capacitor type FRAM cell used in preferred embodiments of the present invention will now be described.

Figure 5A:
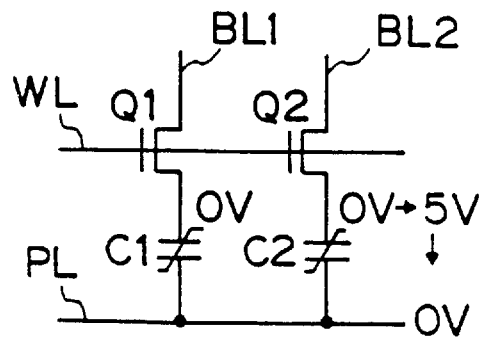
FIGS. 5A–5C illustrate electrical fields applied to a ferroelectric capacitor and the states of polarization of the capacitor in the course of a write operation performed on a ferroelectric memory having a two-transistor/two-capacitor configuration in which two units of the memory cell shown in FIG. 1 are used.
Figure 5B:
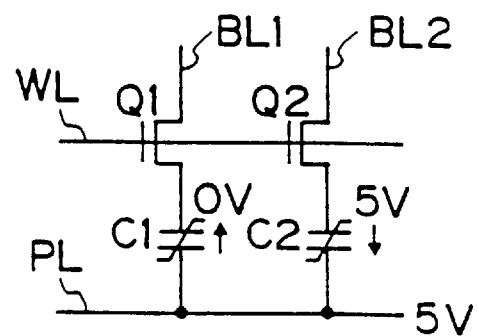
Figure 5C:
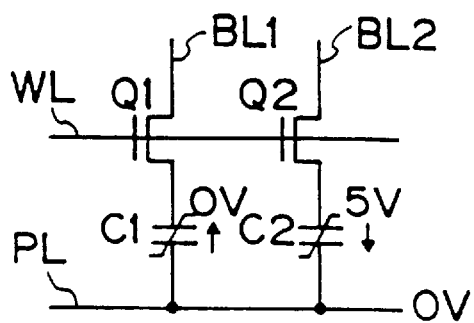
Figure 6A:
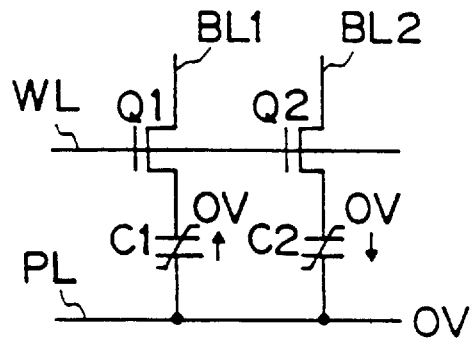
FIGS. 6A–6C illustrate electrical fields applied to a ferroelectric capacitor and the states of polarization of the capacitor in the course of a read operation performed on a ferroelectric memory having a two-transistor/two-capacitor configuration in which two units of the memory cell shown in FIG. 1 are used.
Figure 6B:
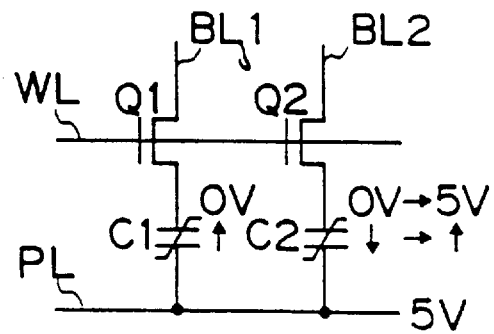
Figure 6C:
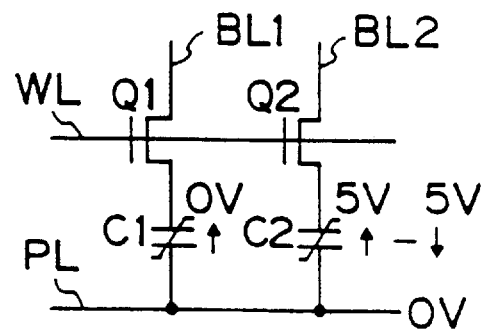

FIGS. 5 and 6 show the state of an electric field applied to a ferroelectric capacitor and the electric polarization of the capacitor during write and read operations to a ferroelectric memory cell having a two-transistor/two-capacitor configuration utilizing two units of the memory cell as shown in FIG. 1.

This ferroelectric memory cell is constituted by a first transistor Q1 and a second transistor Q2, each connected to a word line WL at their respective gates, and a first capacitor C1 and a second capacitor C2 each connected to a plate line PL at their respective plates. The first transistor Q1 and the first capacitor C1 are connected in series, and the second transistor Q2 and the second capacitor C2 are connected in series. The first transistor Q1 and second transistor Q2 are connected respectively to a first bit line BL1 and a second bit line BL2 at one end thereof The word line WL and plate line PL are provided in parallel. A word line signal is supplied to the word line WL from a row decoder (not shown) for the word line while a plate line voltage VPL is supplied to the plate line PL from a row decoder (not shown) for the plate line. It should be noted that not all the plate lines are commonly connected, unlike the arrangement in a DRAM wherein a predetermined potential (e.g., $V_{SS}/2$) is applied to all of the plate lines PL. Further, a sense amplifier for sense amplification of the electric potential of a bit line (not shown), a write circuit (not shown), and a precharge circuit (not shown) are connected to the two bit lines BL1 and BL2.

Figure 7:
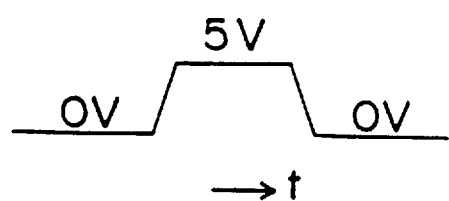
FIG. 7 illustrates the sequence of voltages applied to a ferroelectric memory having a two-transistor/two-capacitor configuration for the write operation shown in FIGS. 5A–5C and for the read operation shown in FIGS. 6A–6C.

During a data writing or reading operation on the ferroelectric memory cell described above, the direction of dielectric polarization is controlled by changing the electric potential of the plate line PL of the selected memory cell from 0 V to 5 V, for example, and then from 5 V to 0 V as shown in FIG. 7. Specifically, for a write operation the plate line PL is initially set at a ground potential $V_{SS}$ (0 V) and each of the two bit lines BL1 and BL2 is initially precharged to 0 V. If one of the two bit lines BL1 and BL2 (for example, the second bit line BL2) is set at 5 V as shown at (a) in FIG. 5 and 5 V is applied to the word line WL to turn the two transistors Q1 and Q2 on, a potential difference is produced across the second capacitor C2 to polarize the dielectric film, for example, in the downward direction in the figure, but no polarization occurs in the first capacitor C1. If the plate line PL is then set at 5 V as shown at (b) in FIG. 5, a potential difference is produced across the first capacitor C1 to polarize the dielectric film in the upward direction in the figure, but the polarization of the second capacitor C2 is not inverted. As a result, the dielectric films of the two capacitors C1 and C2 are polarized in opposite directions as shown, which may correspond to a state wherein data "1" or "0" is stored in the memory cell. Then, the plate line PL and word line WL are set at 0 V as shown at (c) in FIG. 5 to turn the two transistors Q1 and Q2 off, thereby completing the write operation.

For a read operation, the plate line PL is initially set at 0 V and the two bit lines BL1 and BL2 are initially precharged to 0 V. It is assumed here that the two capacitors C1 and C2 have data written therein in the form of opposite polarization directions within the information storage capacitors as shown at (a) in FIG. 6. First, as shown at (b) in FIG. 6, the plate line PL is set at 5 V and a voltage of, for example, 5 V is applied to the word line WL to turn on the two transistors Q1 and Q2. Then, a potential difference is produced across the second capacitor C2 to invert the direction of polarization of the dielectric film within the capacitor C2, but the direction of the polarization of the first capacitor C1 is not inverted. The potentials read from the two capacitors C1 and C2 are amplified by a sense amplifier and the sense amplifier sets the two bit lines BL1 and BL2 to 0 V and 5 V, respectively. The read data is determined to be "1" or "0" based on the output of the sense amplifier. Then, the plate line PL is set at 0 V as shown at (c) in FIG. 6. This produces a potential difference across the second capacitor C2 which inverts the polarization of the dielectric film within the capacitor C2, but the direction of the polarization of the first capacitor C1 is not inverted. Thus, the initial state is recovered and the read operation is complete.

FIG. 7 shows the states of the potential applied to a plate electrode at different times for either the write operations illustrated in FIG. 5 or the read operations illustrated in FIG. 6.

A power on reset signal PWRON generated by a power on reset circuit may be used in a ferroelectric memory to prevent an undesired memory access from being initiated when the power supply is first turned on, in a manner similar to how such a signal is used in a DRAM. In an FRAM, however, measures must be taken to prevent the power on reset signal from causing inversion of the polarization of the ferroelectric material within the memory capacitor, which inversion is a corruption of the data stored in the ferroelectric memory.

Figure 8:
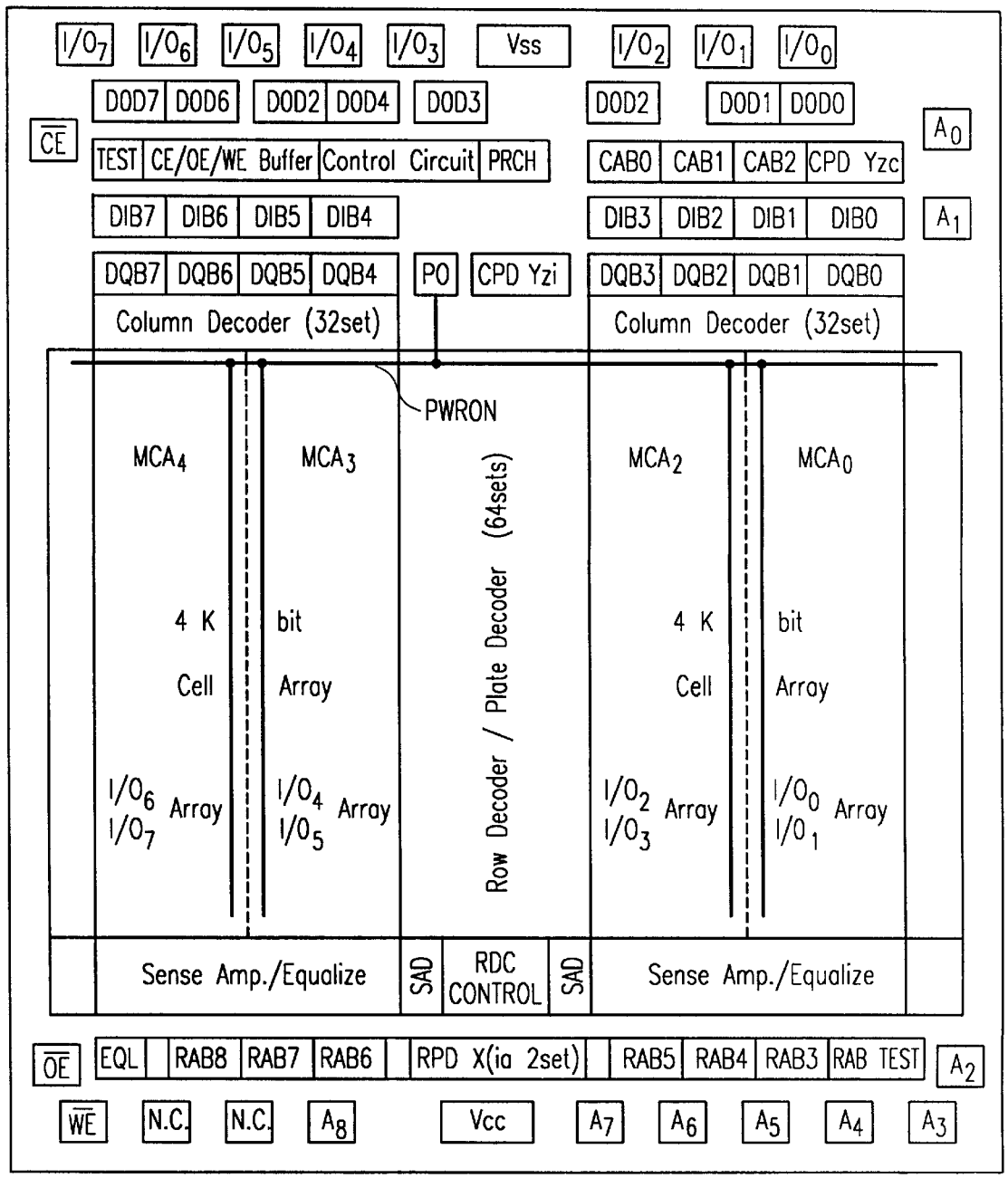
FIG. 8 is a floor plan for a ferroelectric memory according to an embodiment of the present invention.

FIG. 8 shows a floor plan for a ferroelectric memory according to the present invention. This ferroelectric memory is constituted by four memory cell arrays MCAi, 64 row decode circuits, 64 plate decode circuits, a bit line equalize circuit EQL, sense amplifier circuits, and the other circuits used within an FRAM. As illustrated, a power on reset signal output by a power on reset circuit P0 is supplied to each memory cell array.

Figure 9:
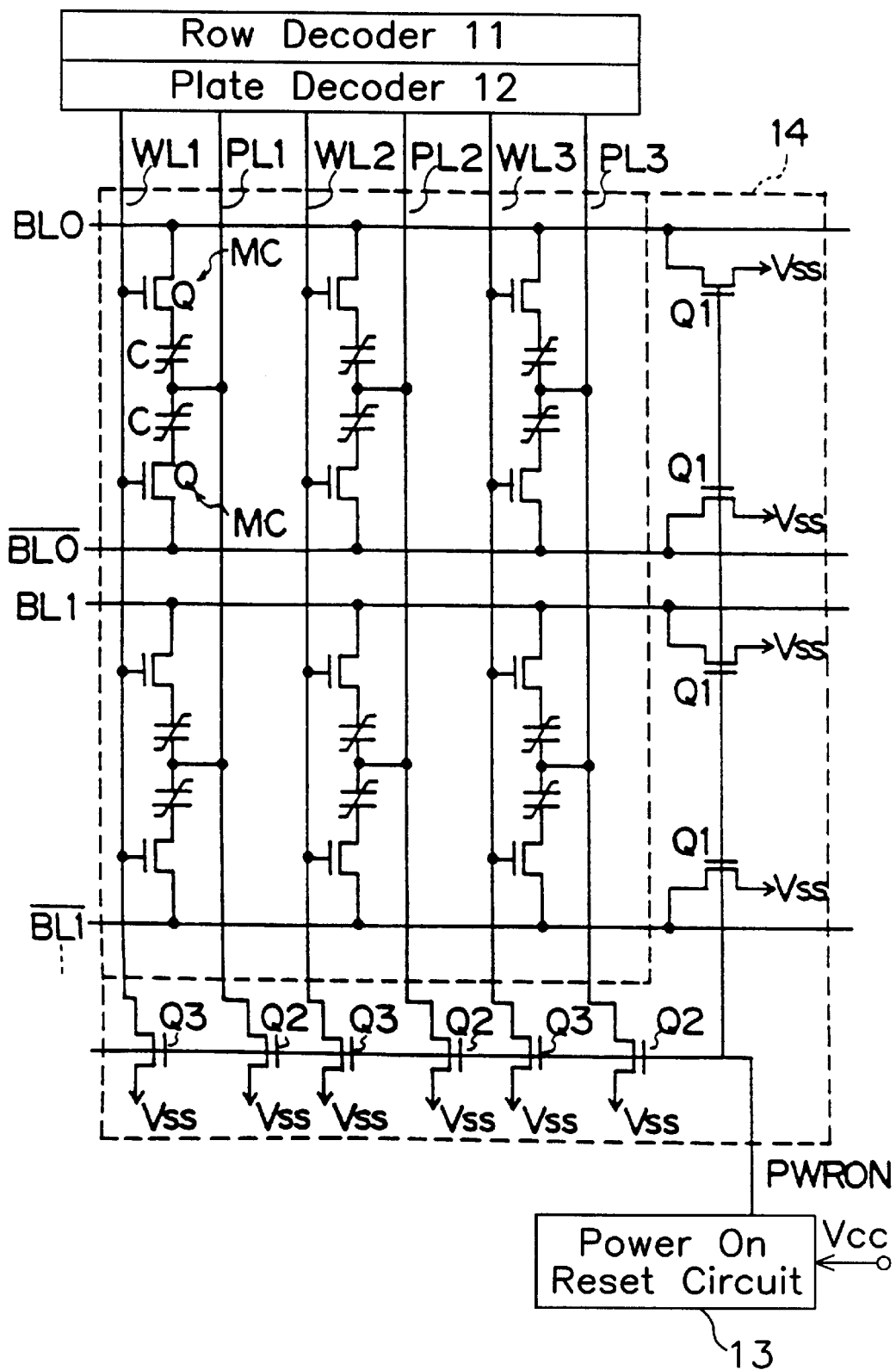
FIG. 9 illustrates a configuration of a memory cell array MCA0 in greater detail.

FIG. 9 illustrates a circuit configuration of a memory cell array MCA0 in greater detail. In the figure, MC designates a plurality of ferroelectric memory cells each constituted by a ferroelectric capacitor C for storing information utilizing a ferroelectric material for the inter-plate insulation film. Memory cell MC also includes a MOS transistor Q for transferring electrical charges connected in series with the capacitor C. Memory cells MC are arranged in the form of a matrix within the memory cell array 10. WLi (WL0, WL1, WL2, etc.) represents a plurality of word lines, each of which is connected in common to the gates of the transistors Q of memory cells in one row. PLi (PL0, PL1, PL2, etc.) represents a plurality of plate lines each of which is connected in common to the plates of the capacitors C of memory cells in the same row. BLi, /BLi (BL0, /BL0, BL1, /BL1, etc.) represent a plurality of bit lines each of which is commonly connected to one end of the transistor of memory cells in the same row.

A row decoder circuit 11 selects a part of the plurality of word lines WLi according to an address signal and supplies a word line voltage to them. A plate decoder circuit 12 selects a part of the plurality of word lines PLi according to the address signal and controls the voltage of the selected plate lines PLi.

A power on reset circuit 13 is configured to generate a power on reset signal PWRON which is at a "High" level for a predetermined period of time immediately after the power supply is turned on. The power on reset signal PWRON controls a bit line potential generation circuit, an SSB circuit, etc. (not shown) to control respective electric potentials (VBL, VBB, etc.) and controls an access control circuit (not shown) which prevents undesirable access to the memory when the power supply is initially turned on.

According to the present invention, an erroneous programming prevention circuit 14 is provided within the FRAM which is capable of preventing the corruption of data stored in the ferroelectric memory cells MC. Such data corruption can arise when the polarization of the memory cell MC is inverted when the power on reset signal PWRON is generated by the power on reset circuit 13. In a preferred embodiment, erroneous programming prevention circuit 14 includes a plurality of first switching transistors Q1 each connected between bit lines BLi, /BLi and nodes at a predetermined potential (e.g., $V_{SS}$) and second switching transistors Q2 connected between the plate lines PLi and nodes at a predetermined potential (e.g., $V_{SS}$). The first switching transistors Q1 and second switching transistors Q2 are controlled by the power on reset signal PWRON so that they are on for a predetermined period of time after the power supply is turned on. In this regard, the "predetermined" period of time represents an amount of time sufficient to ensure that no undesired inversion of the polarizations of the ferroelectric material will occur. At the present time, it appears that this "predetermined" time period must be empirically determined, since no mechanism for the previously discussed inversion error has been identified at this time.

According to the present invention, the first switching transistors Q1 and second switching transistors Q2 are, for example, NMOS transistors connected so that the erroneous programming prevention circuit 14 is activated when a "High" level power on reset signal PWRON is supplied to the respective gates, and a ground potential $V_{SS}$ (a predetermined potential) is supplied to the nodes to which the ends of each of transistors Q1 and Q2 are connected. In the ferroelectric memory of this embodiment, each of the plurality of first switching transistors Q1 is controlled by the power on reset signal PWRON so that it is on for a predetermined period of time after the power supply is initially turned on so that all of the bit lines BLi and /BLi are set at the ground potential $V_{SS}$. The present inventors have observed that when the erroneous programming circuit 14 is used in conjunction with the power on signal PWRON, the polarization of the ferroelectric memory cells MC is not inverted, and the data stored within the FRAM is not corrupted.

The second switching transistors Q2 are connected between all of the plate lines PLi and a ground potential node so that all of the plate lines PLi are set at the ground potential $V_{SS}$. In this way, all of the plate lines PLi are controlled by the power on reset signal PWRON so that they are on for a predetermined period of time when the power supply is turned on. As a result, all plate lines PLi are set at the ground potential $V_{SS}$ in the same manner as the bit lines BLi and /BLi. This makes it possible to prevent inversion of the polarization of the ferroelectric memory cells MC when a power on reset signal is active within the FRAM and thus prevents the corruption of the data stored therein.

Figure 10:
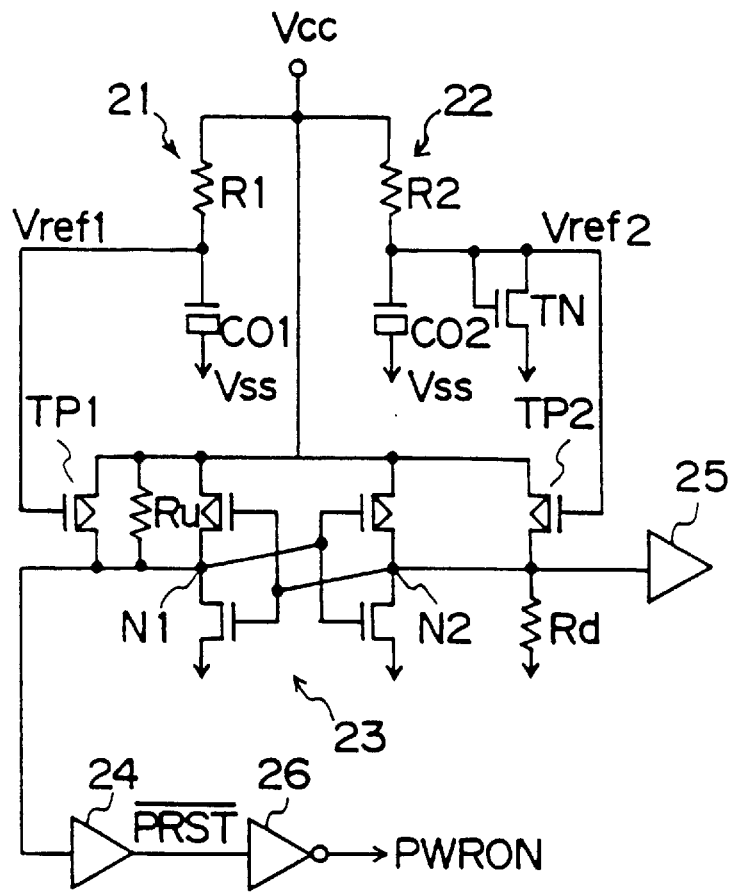
FIG. 10 is a circuit diagram showing an example of the power on reset circuit shown in FIG. 8.

FIG. 10 is a circuit diagram of an example of the power on reset circuit 13 shown in FIG. 9. This power on reset circuit itself is similar to those used in conventional DRAM's. As such, general aspects of the structure and operation of the power on reset circuit 13 shown in FIG. 10 will be familiar to those of ordinary skill. In a preferred embodiment the power on reset circuit includes a first reference potential generation circuit 21 formed by a first resistor R1 and a first capacitor C01 connected in series between a power supply node and a ground node. Preferably, the power supply potential $V_{CC}$ is supplied from an external source.

A second reference potential generation circuit 22 includes a second resistor R2 and a second capacitor C02 connected in series between the power supply node and the ground node. The second reference potential generation circuit also includes an NMOS transistor TN whose drain and gate are connected together. NMOS transistor TN is connected in parallel with the second capacitor C02. CMOS flip-flop circuit 23 is connected between the power supply node and ground node and a first PMOS transistor TP1 is connected between the power supply node and a first output node N1 of the CMOS flip-flop circuit 23. PMOS transistor TP1 receives at its gate a potential Vref1 output by the first reference potential generation circuit 21. Pull-up resistor Ru is connected between the first output node N1 and the power supply node, and the input node of a first buffer circuit 24 is connected to the first output node N1.

A second PMOS transistor TP2 is connected between the power supply node and a second output node N2 of the CMOS flip-flop circuit 23. The gate of PMOS transistor TP2 is connected to receive a potential Vref2 output by the second reference potential generation circuit 22. Pull-down resistor Rd is connected between the second output node N2 and the ground node, and the input node of a second buffer circuit 25 is connected to the second output node N2 CMOS inverter circuit 26 inverts a signal /PRST output by the first buffer circuit 24 and outputs the power on reset signal PWRON.

Figure 11:
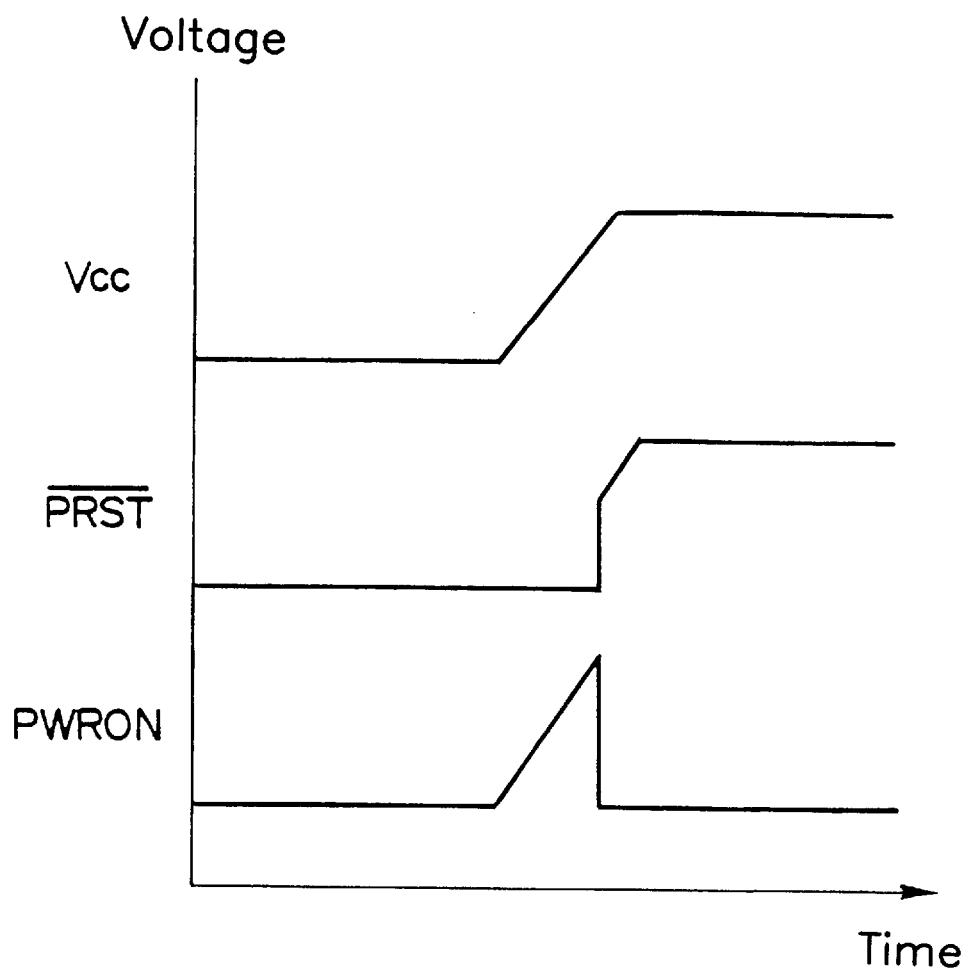
FIG. 11 is a waveform diagram showing an example of the voltage waveform present at each part during the operation of the power on reset circuit in FIG. 10.

The second reference potential generation circuit 22 is configured similarly to the first reference potential generation circuit 21 but with the addition of NMOS transistor TN. The potential Vref2 output by the second reference potential generation circuit 22 is always lower than the potential Vref1 output by the first reference potential generation circuit 21 (Vref2<Vref1) when the power supply $V_{CC}$ is turned on. As a result, the first PMOS transistor TP1 turns off earlier than the second PMOS transistor TP2, switching the first output node N1 of the CMOS flip-flop circuit 23 to the "High" level so that the output signal /PRST of the first buffer circuit 24 becomes the "High" level. The output signal PWRON of the CMOS inverter circuit 26 rises as the power supply $V_{CC}$ rises and then falls to a "Low" level when the signal /PRST rises to the "High" level. The relative potentials and timings of $V_{CC}$, /PRST and PWRON are schematically illustrated in FIG. 11.

Although all of the bit lines BL, word lines WL, and plate lines PL are grounded in the illustrated embodiment, it is of course possible to ground only the bit lines BL and word lines WL or only the bit lines BL and plate lines PL to prevent the undesired inversion of ferroelectric polarizations within the memory cells.

FIGS. 12 through 26 show various control circuits of the ferroelectric memory in FIG. 8 other than the memory cell array power on reset circuit. Since this circuitry is similar in configuration and in operation to the corresponding circuitry within conventional DRAMs, only brief descriptions of this circuitry are provided herein.

Figure 12:
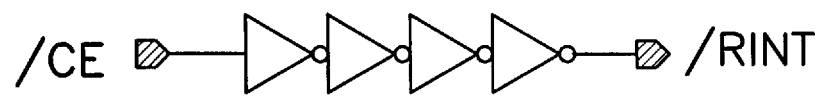
FIG. 12 illustrates a configuration of a chip enable signal buffer circuit.
Figure 13:
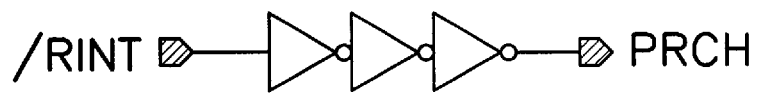
FIG. 13 illustrates a configuration of a precharge signal generating circuit.

FIG. 12 illustrates in detail a configuration of a buffer circuit for a chip enable signal /CE (typically supplied from a /CE pad). This circuit outputs a /RINT signal as one of a number of internal row control signals. The FIG. 12 buffer circuit is typically included as part of the CE/OE/WE buffer illustrated in FIG. 8. FIG. 13 illustrates a configuration of a precharge signal generation circuit, indicated by "PRCH" in FIG. 8. This circuit outputs a precharge signal PRCH.

Figure 14:
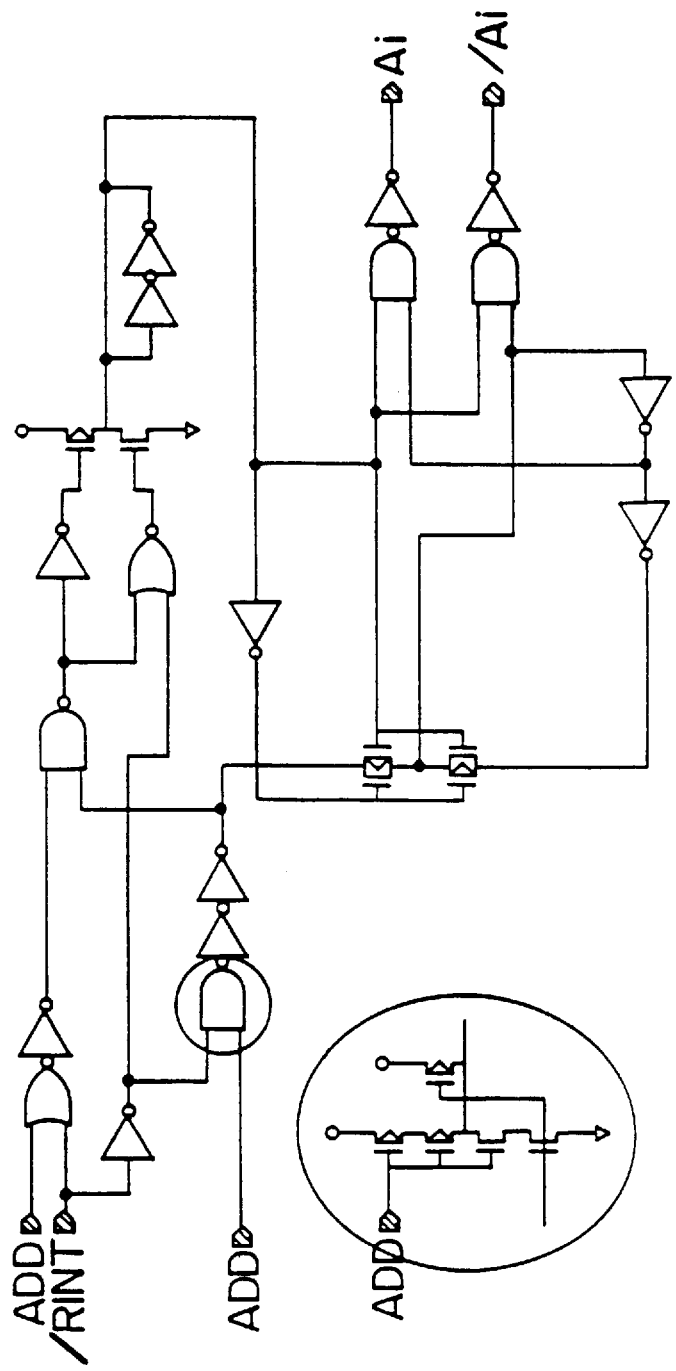
FIG. 14 illustrates a configuration of an address buffer circuit.

FIG. 14 illustrates a configuration of an address buffer circuit in detail. The FIG. 14 circuit is a single bit channel of the FRAM address buffer circuitry. Single bit buffer circuits are provided in the peripheral circuitry of the FIG. 8 FRAM as column address buffers (CAB0 to CAB2) and as row address buffers (RAB3–RAB8). The FIG. 14 circuit receives address signals ADD supplied to terminals A0 through A8 and outputs an internal address A1. As illustrated in FIG. 8, the quantity of the FIG. 14 circuits provided corresponds to the number of address bits provided at terminals A0 to A8 of the FIG. 8 FRAM.

Figure 15:
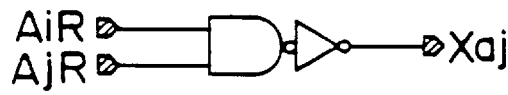
FIG. 15 illustrates a configuration of a row partial decode circuit.
Figure 16:
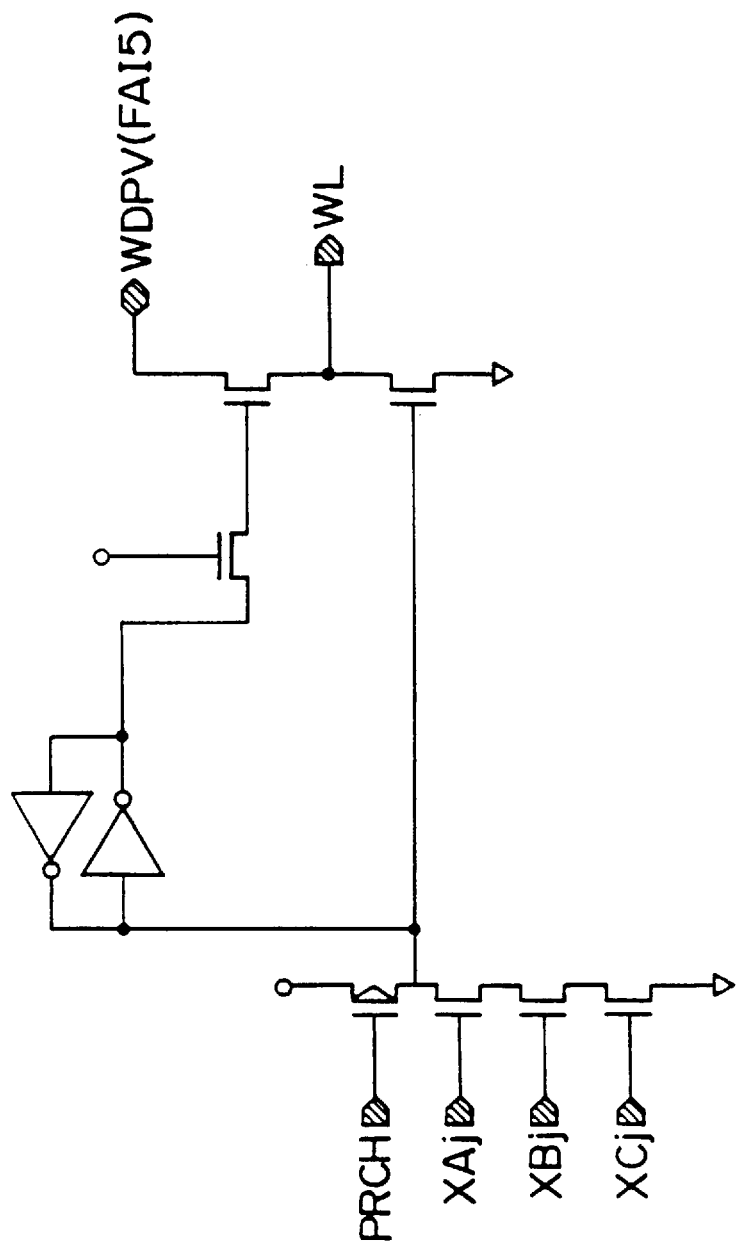
FIG. 16 illustrates a configuration of a row decode/word line drive circuit.

FIG. 15 illustrates a configuration of a row partial decode circuit which corresponds to the circuit "RPD" shown in FIG. 8. The FIG. 15 circuit outputs a partial decode signal X to the row decoder circuitry (FIG. 8) or, equivalently, to the row decoder/word line drive circuit shown in FIG. 16. The table set forth as part of FIG. 15 shows how the various partial decode signals are generated from the inputs to the row partial decode circuit. FIG. 16 illustrates a configuration of a row decode/word line drive circuit. This circuit receives the partial decode signal X from the FIG. 15 partial decode circuit and the precharge signal PRCH from the FIG. 13 precharge signal generation circuit. The FIG. 16 circuit decodes and drives the word lines WL.

Figure 17B:
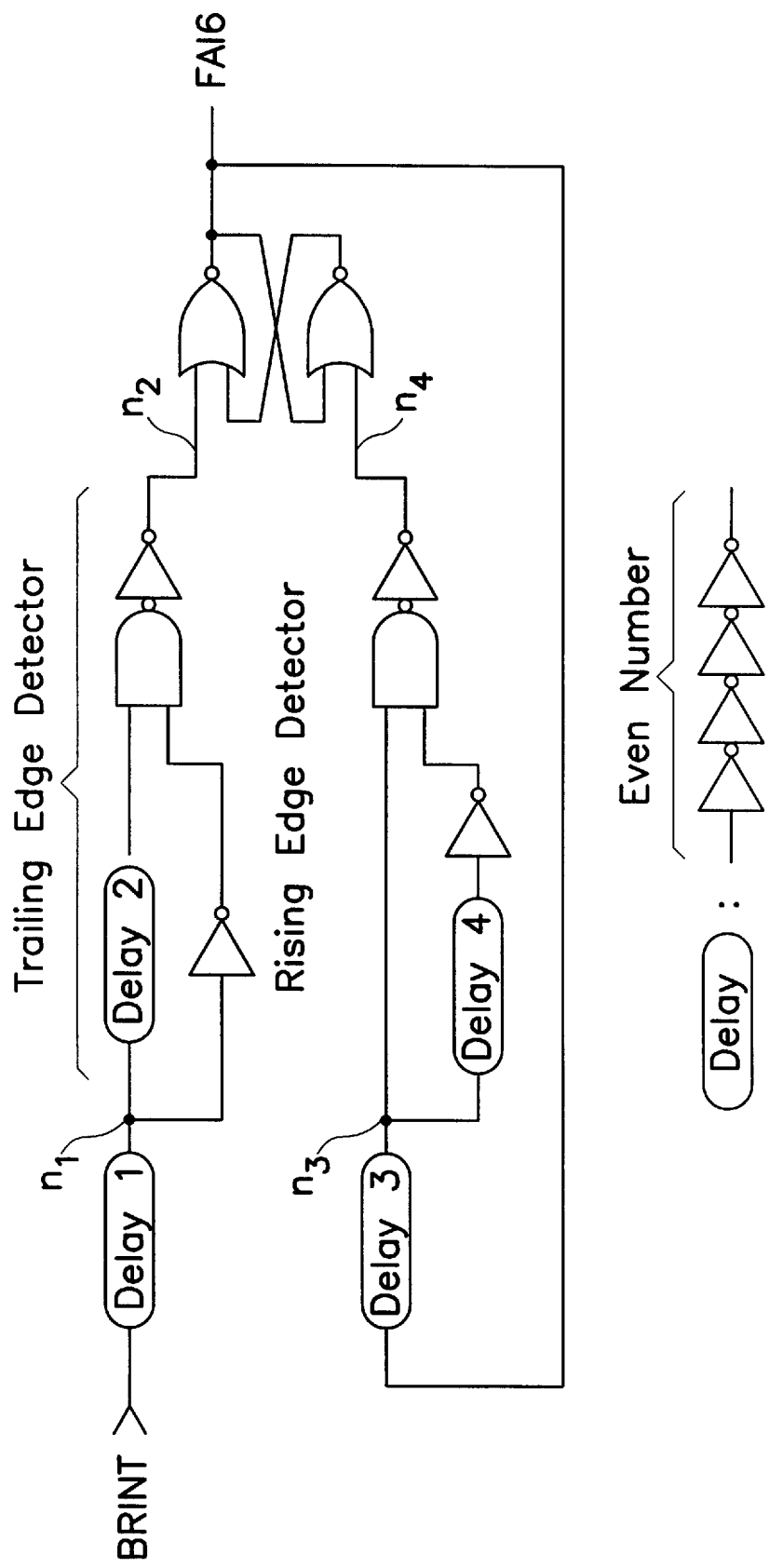
Figure 17C:
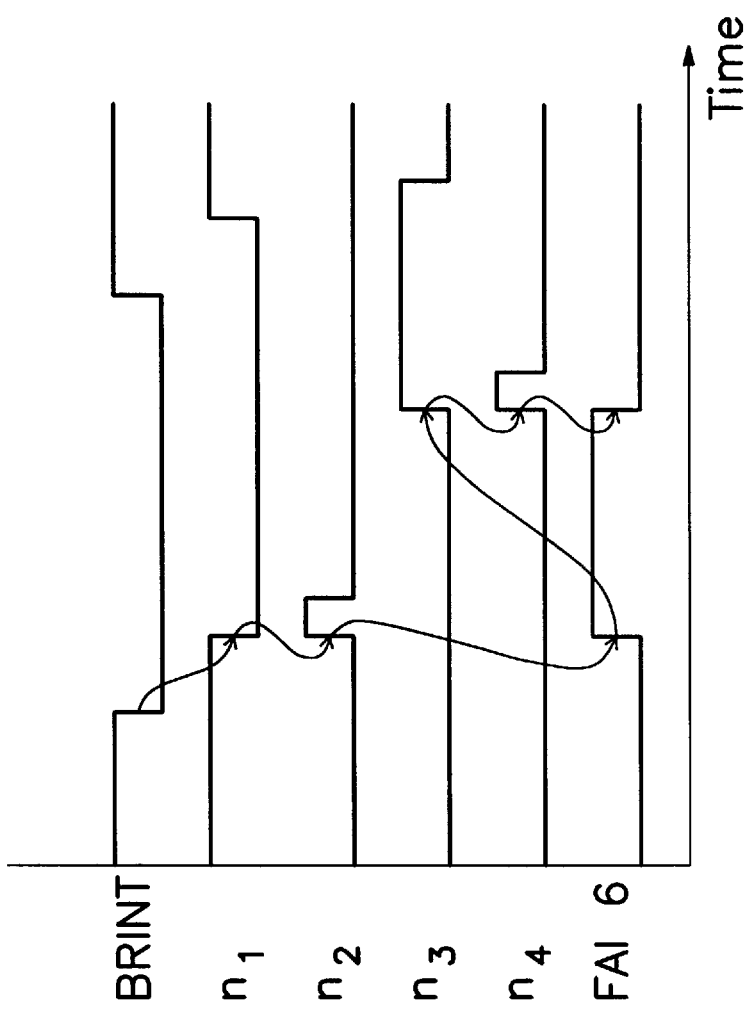

FIG. 17a illustrates a configuration of a plate decode circuit suitable for use within the plate decoder circuitry of the FIG. 8 FRAM. The FIG. 17a circuit performs a logical operation on a word line signal generated by the FIG. 16 row decode/word line drive circuit and on a control signal FAI6. Control signal FAI6 is generated by the circuitry illustrated in FIG. 17b in response to the signal /RINT. The general sequence of timing signals is shown in FIG. 17c. As illustrated in 17b & c, the signal /RINT is provided to a delay 1 circuit, which may for example consist of an even number of inverters connected in series. The output of the delay 1 circuit is provided at node n1 to a trailing edge detector that outputs a pulse to node n2 when the signal at n1 falls. The trailing edge detector may consist of a delay 2 circuit connected in parallel with an inverter, where the outputs from the delay 2 circuit and the inverter are provided sequentially to a NAND gate, an inverter and a pair of cross-coupled NOR gates. The output of the NOR gates is provided first to a delay 3 circuit, which generates a high signal at node n3 after a delay. The signal from node n3 is provided to a rising edge detector as illustrated, which outputs a pulse at node n4 when the signal n3 rises. The signal FAI6 is the output of the cross-coupled NOR gates, so that the signal FAI6 rises when the signal at node n2 first rises and the signal FAI6 remains high until the pulse signal at node n4 occurs. Thus, the signal FAI6 is a pulse which rises a fixed delay period after /RINT goes low and FAI6 remains high for a fixed period of time before returning to a low level.

Figure 18:
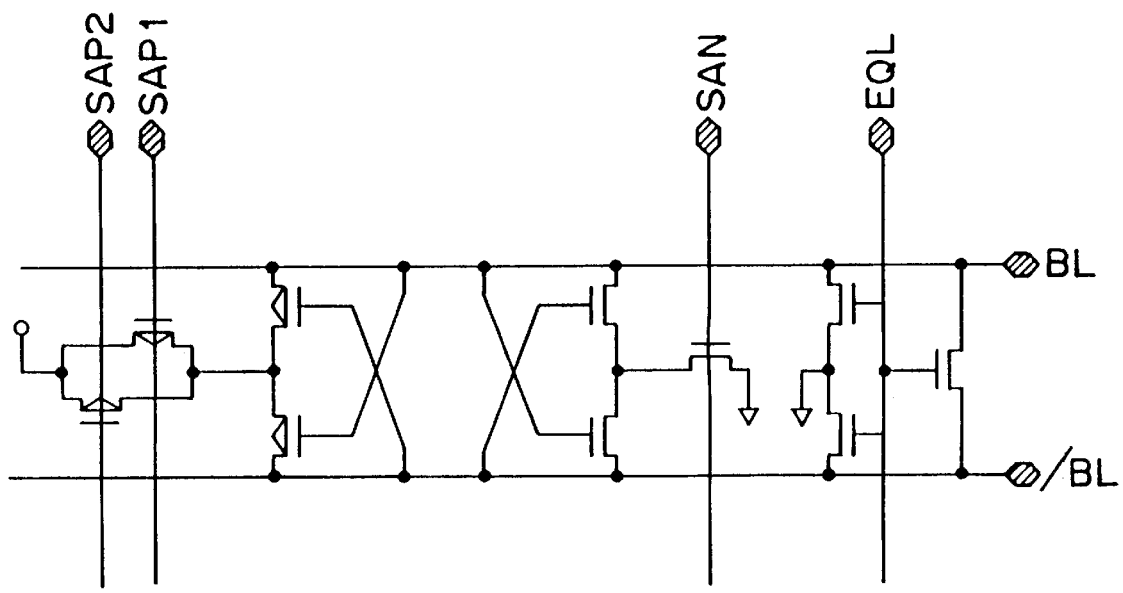
FIG. 18 illustrates circuit configurations of a sense amplifier, an equalize circuit, etc.
Figure 19:
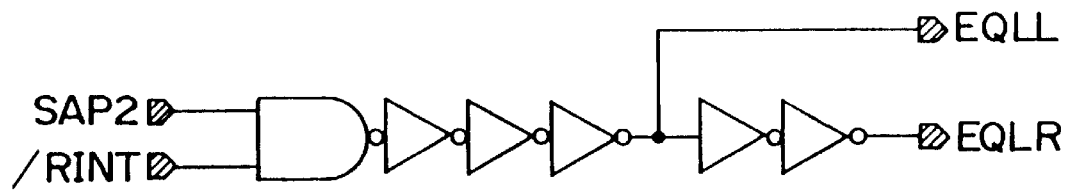
FIG. 19 illustrates a configuration of an equalize circuit driving circuit for driving the equalize circuit shown in FIG. 18.
Figure 20:
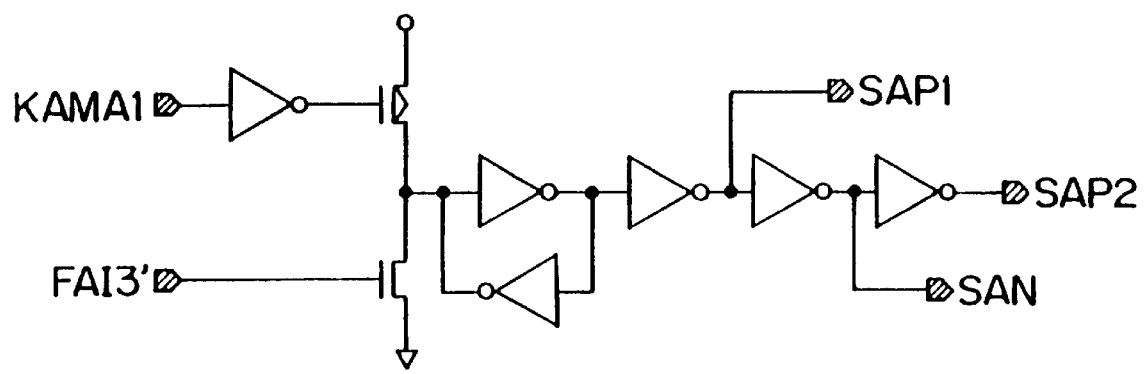
FIG. 20 illustrates a configuration of a sense amp driver circuit.

FIG. 18 illustrates circuit configurations of a sense amplifier, an equalize circuit, and other circuits connected to the bit lines. A pair of bit lines BL and /BL are equalized prior to a read operation. Then, after the word line rises, SAN is driven to the "High" level with a time delay. As a result, a very small potential difference between the bit lines is amplified, preferably to detectable logic levels. The sense amplifier and equalize circuits illustrated in FIG. 18 may be used within the "Sense Amp./Equalize" circuit blocks of the FRAM illustrated in FIG. 8. FIG. 19 illustrates in detail a configuration of an equalize circuit driving circuit for driving the equalize circuit shown in FIG. 18. The FIG. 19 circuit is particularly adapted for use in the FIG. 8 FRAM because the FIG. 19 circuit generates a right (EQLR) and left (EQLL) equalize signal. FIG. 20 illustrates a configuration of a sense amp driver circuit which may be used in circuit blocks "SAD" within the FIG. 8 FRAM.

Figure 21:
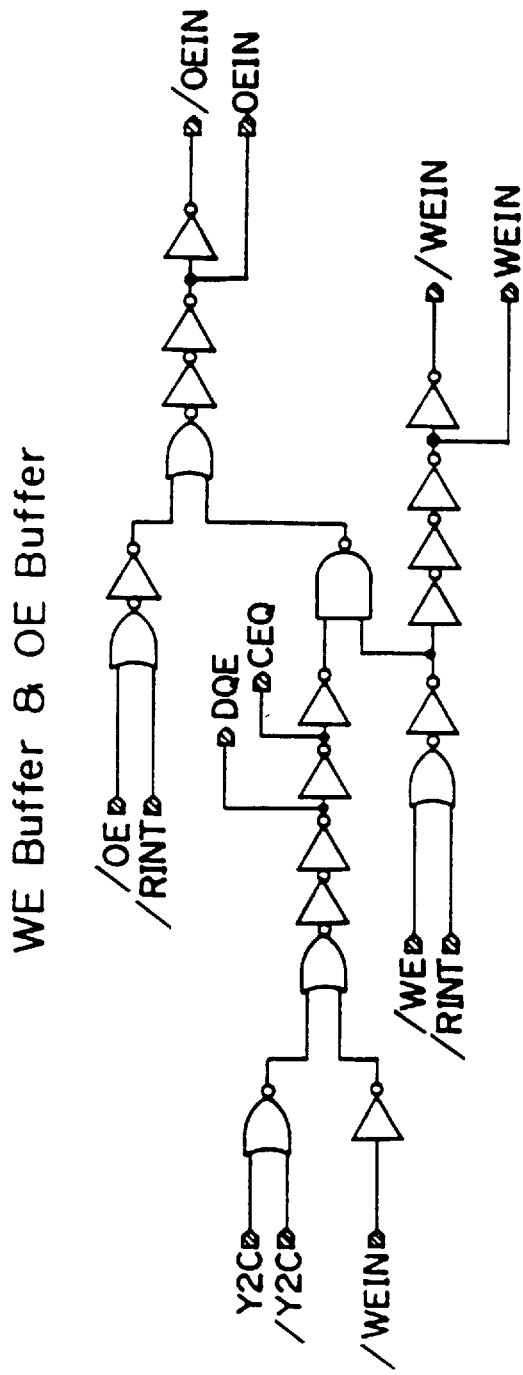
FIG. 21 illustrates a circuit configuration of a write enable/output enable buffer signal buffer.

FIG. 21 illustrates a configuration of a write enable/output enable buffer circuit of a type that may be used within the CE/OE/WE buffer of the FIG. 8 FRAM. A write enable signal /WE and an output enable signal /OE are supplied by a pad /WE and a pad /OE, respectively, within the FIG. 8 FRAM.

Figure 22:
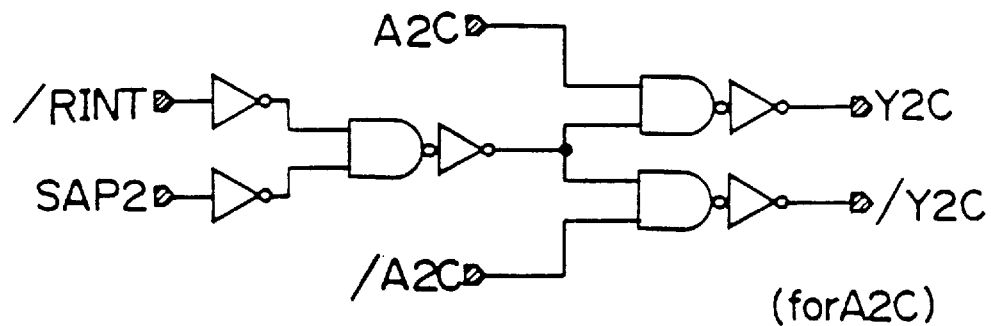
FIG. 22 illustrates a configuration of a column partial decode circuit.
Figure 22:
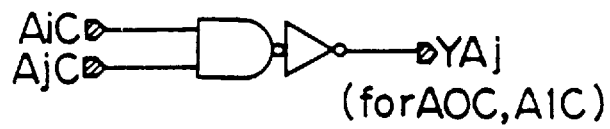
Figure 23:
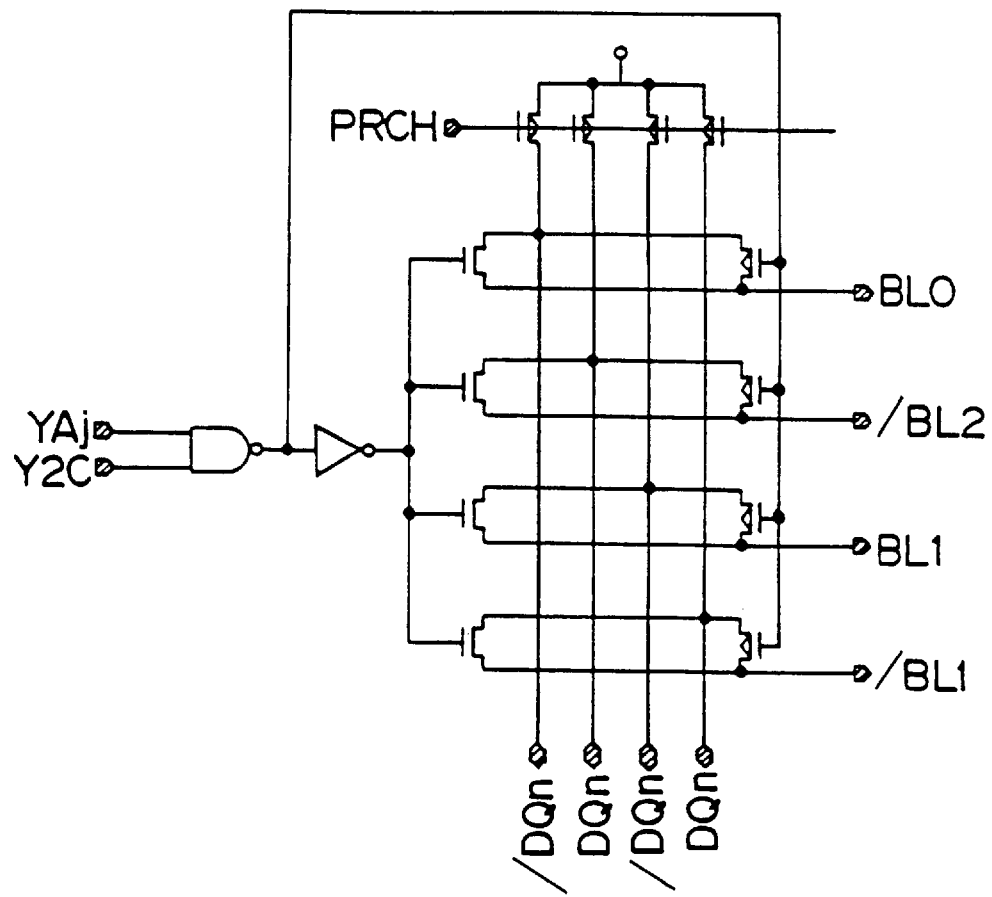
FIG. 23 illustrates a configuration of a column decode circuit.

FIG. 22 illustrates a configuration of a column partial decode circuit which may be used for the circuit block "CPD" within the FRAM of FIG. 8. This circuit receives address signals from the column address buffers (CAB0 to CAB2 in FIG. 8) and outputs a column partial decode signal Y. FIG. 23 illustrates a configuration of a column decode circuit which may, for example, be used within the column decoder circuits of the FIG. 8 FRAM. This circuit selectably connects bit lines to data lines DQ in accordance with the column partial decode signal Y provided by the circuit of FIG. 23.

Figure 24:
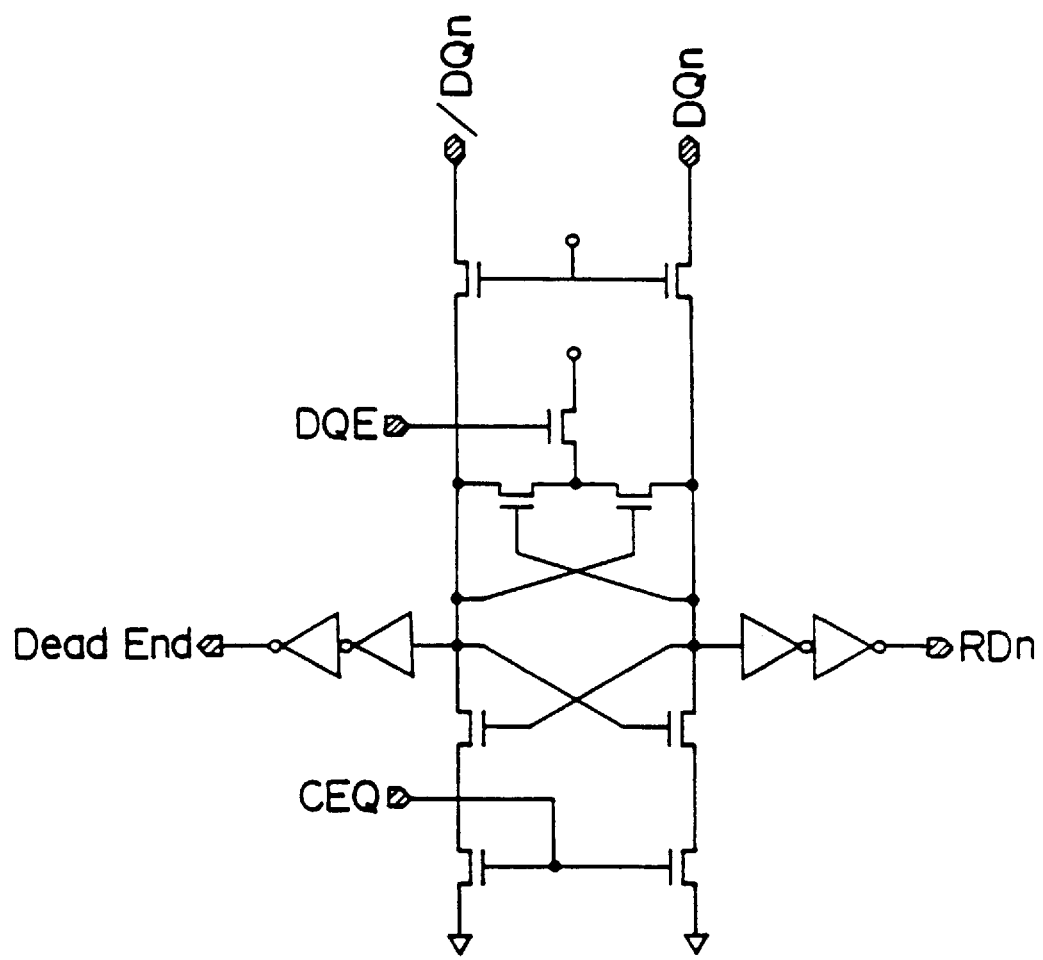
FIG. 24 illustrates a configuration of a data line buffer circuit.
Figure 25:
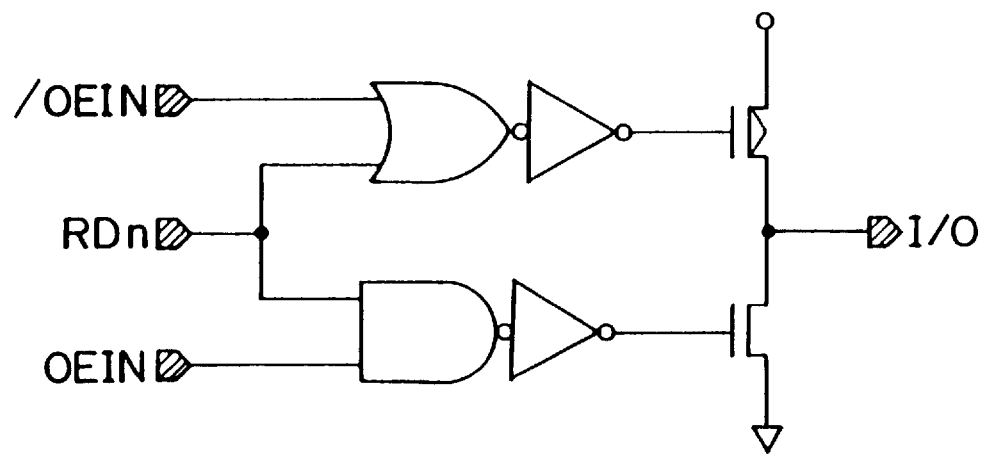
FIG. 25 illustrates a configuration of a data output circuit.
Figure 26:
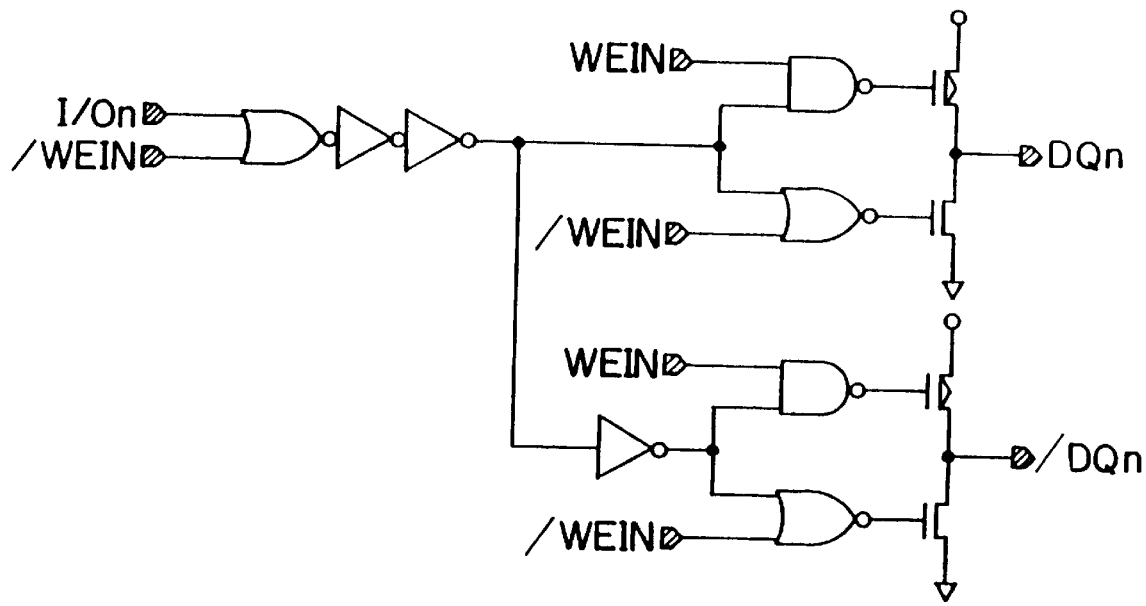
FIG. 26 illustrates a configuration of a data input circuit.

FIG. 24 illustrates a configuration of a data line buffer circuit which may be used within the circuit blocks DQB0–DQB7 of the FIG. 8 FRAM. This circuit amplifies the data on DQ lines. FIG. 25 illustrates a configuration of a data output circuit which may be used within the circuit blocks DOD0–DOD7 of the FIG. 8 FRAM. Each of these circuits is connected to an input/output pad I/O (I/O$_0$–I/O$_7$ in the FIG. 8 FRAM). FIG. 26 illustrates a configuration of a data input circuit of the type that may be used within the circuit block of DIB0–DIB7. This circuit fetches write data supplied to the I/O pad in accordance with the write enable signal generated, for example, by the write enable buffer circuit of FIG. 21.

The operation of the above-described circuits will now be described.

Address-Related Circuits

A chip enable signal /CE (internal /CE) is activated and this signal drives (through the chip enable buffer of FIG. 12) the address buffers (CAB0–CAB2, RAB3–RAB8, and FIG. 14) for reception of addresses. In other words, the address buffers and hence the memory device do not operate unless the signal /CE becomes the "Low" level. The signal /CE within the preferred embodiment of an FRAM corresponds to a signal /RAS in a DRAM.

Row addresses are received at six pins A3 through A8 while column addresses are received at three pins A0 through A2. The row addresses A3 through A8 (stored in buffers RAB3–RAB8) are subjected to partial decoding (FIG. 15) for selecting the word decode/word line drive circuit (FIG. 16) using the signals X α j. One of 64 row decode/word line drive circuits is selected in this manner within the FIG. 8 FRAM. In a preferred embodiment illustrated in FIG. 8, the cell array is split into two parts for reasons of chip layout, and the row decode/word line drive circuits (FIG. 16) are provided between the two parts. Therefore, the word lines are selected on either the left or the right sides. Further, the plate decode circuit (FIG. 17) is provided in the same location as the row decode/word line drive circuit.

The row decode/word line drive circuit of FIG. 16 is almost the same as the row decode/word line drive circuit used in a DRAM. However, since the word line drive signal is not boosted, the data output by the word lines includes a voltage drop Vth. The plate decode circuit becomes the "High" and "Low" levels in synchronism with the control signal FAI6 (FAI6 is illustrated by FIG. 17a–17c and described above).

The column addresses A0 and A1 are similarly subject to partial decoding (FIG. 22) to provide signals Y α j, while only the address A2 is used to generate a sense amp signal SAP2. The signal A2 is delayed to produce the pulse Y2C. The column decode circuit is provided with the signals Y α j and Y2C. Eight sets of Y α j (α=A, B, or C and j=0–3) are at the "High" level. The plate decode circuit (FIG. 17a–c) introduces a certain delay so that only the plate lines associated with activated word lines are activated by the plate decode circuit. For the selected plates, the FAI6 signal cycles the ferroelectric material through a complete hysteresis curve.

The sense amplifier (FIG. 18) is driven by transferring signals (SAP and SAN), provided by the sense amp driver circuit of FIG. 20, which initiates operation when an FAI3 signal is at the "High" level. The KAMA1 signal provided to the sense amp driver circuit of FIG. 20 is a signal to stop the sense amplifier when a precharge operation takes place.

Circuits Related to Column and Data Transfer

A column decode circuit (FIG. 23) is selected as a result of the activation of one of eight combinations of Y α j (α=A, B, or C, j=0–3), Y2C, and /Y2C within the column partial decode circuit of FIG. 22. The relationship between the bit lines and the I/O terminals is as shown in the circuit diagrams of FIGS. 24 and 25. One column decoder is associated with two I/O terminals. The data line buffer circuit (FIG. 24) is precharged to the power supply potential V$_{CC}$ and operates in response to the signals Y2C and /Y2C through the write enable/output enable buffer of FIG. 24 to transfer data to an RD line. The I/O pin of the data output circuit of FIG. 25 is "Hi-Z" (high impedance) until /OE becomes the "Low" level. When /OE becomes "Low", data are output to the I/O terminals.

The data input circuit (FIG. 26) which operates during data writing accepts data when both of /WE and /RINT rise and latches the data when /WE rises to allow the data to be directly written to the DQ line. Control signals such as DQE are preferably not active during data writing so that the data input circuit of FIG. 26 does not interfere with the data writing operation.

Various alternative embodiments of the present invention will now be described. The first three embodiments are circuits for grounding the word lines. The next two embodiments are circuits for grounding the bit lines. The last embodiment is a circuit for grounding the plate electrode lines.

1. First Alternative Embodiment.

Figure 27:
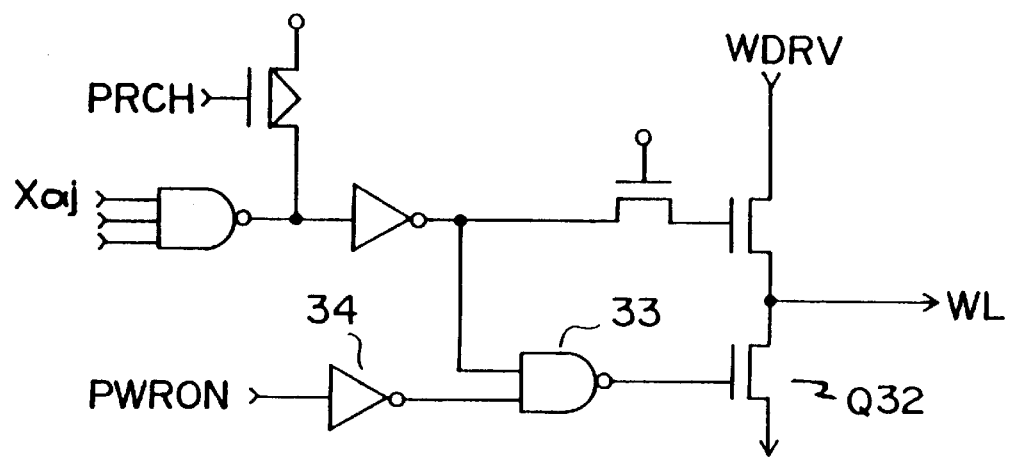
FIG. 27 is a circuit diagram showing a first alternative embodiment of the present invention.

FIG. 27 shows a circuit to be used in place of the word line drive circuit shown in FIG. 16. The power on reset signal PWRON is supplied to a NAND gate 33 through an inverter circuit 34. The NAND gate 33 performs a NAND operation on the drive control signal and the power on reset signal PWRON, and the output signal of the NAND gate 33 drives a transistor Q32 which corresponds to a noise killer transistor in the word line driver circuit. Such a configuration makes it possible to eliminate the need for the erroneous programming circuit 14 provided for each word line, at least as far as the word lines are concerned.

2. Second Alternative Embodiment.

Figure 28:
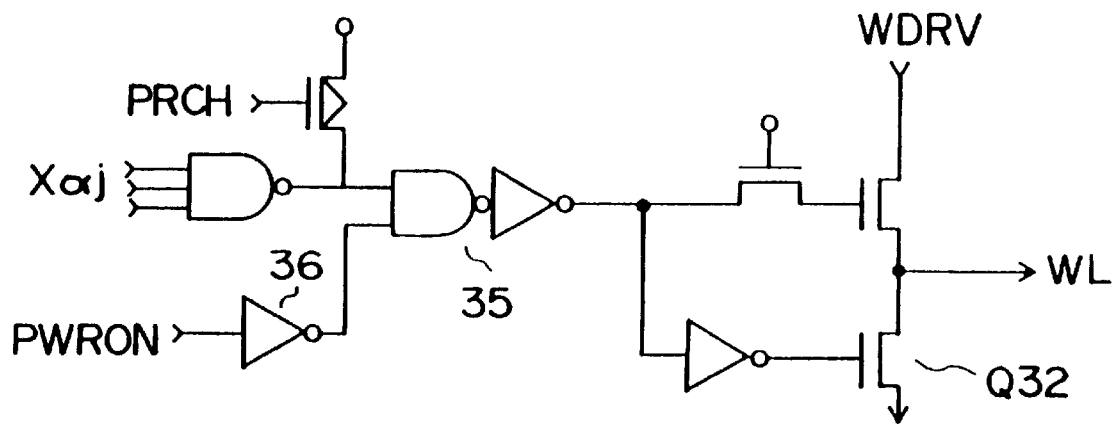
FIG. 28 is a circuit diagram showing a second alternative embodiment of the present invention.

FIG. 28 shows a circuit which also may be used in place of the word line drive circuit shown in FIG. 16. The power on reset signal PWRON is supplied to a NAND gate 35 through an inverter circuit 36. The NAND gate 35 performs a NAND operation on the drive control signal and the power on reset signal, and the output signal of the NAND gate 35 drives a transistor Q32 which corresponds to a noise killer transistor in the word line drive circuit through an inverter circuit having two stages. Such a configuration also makes it possible to eliminate the need for the erroneous programming circuit 14 provided for each word line, at least as far as the word lines are concerned.

3. Third Alternative Embodiment.

Figure 29:
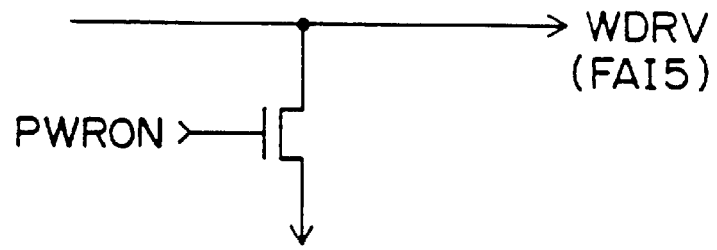
FIG. 29 is a circuit diagram showing a third alternative embodiment of the present invention.

FIG. 29 shows a circuit which resets the word line drive (WDRV) signal FAI5 in response to the power on reset signal PWRON. Such a configuration also makes it possible to eliminate the need for the erroneous programming circuit 14 provided for each word line, at least as far as the word lines are concerned.

4. Fourth Alternative Embodiment.

Figure 30:
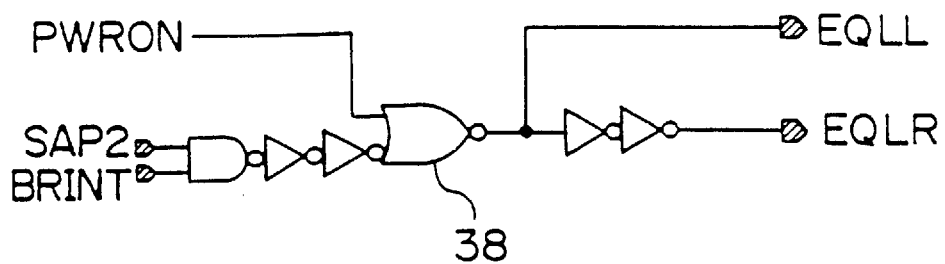
FIG. 30 is a circuit diagram showing a fourth alternative embodiment of the present invention.

FIG. 30 shows an equalize control circuit to be used in place of the circuit shown in FIG. 19. A NOR circuit 38 performs a NOR operation on the power on reset signal and on an equalize control signal. Such a configuration also makes it possible to eliminate the need for the erroneous circuit 14 provided for each bit line, as far as the bit lines are concerned.

5. Fifth Alternative Embodiment.

Figure 31:
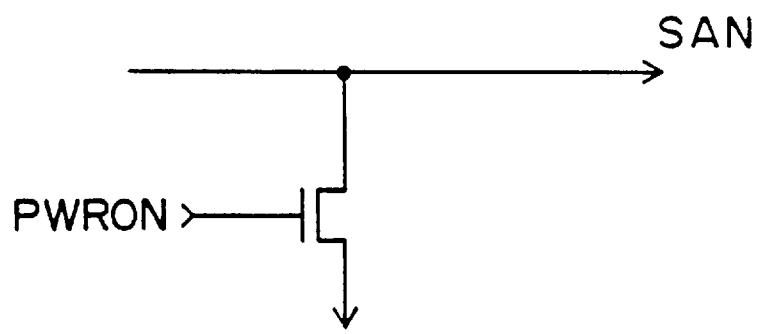
FIG. 31 is a circuit diagram showing a fifth alternative embodiment of the present invention.

FIG. 31 shows a circuit which resets the signals SAP and SAN in response to the power on reset signal PWRON. Such a configuration also makes it possible to eliminate the need for the erroneous programming circuit 14 provided for each bit line, as far as the bit lines are concerned.

6. Sixth Alternative Embodiment.

Figure 32:
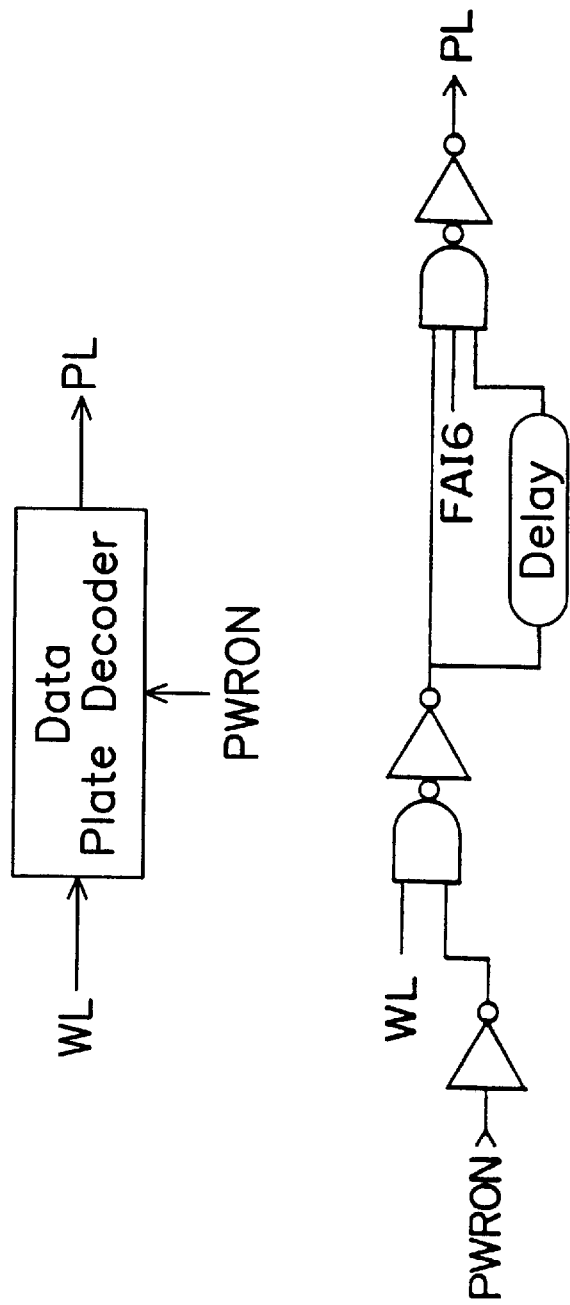
FIG. 32 is a circuit diagram showing a sixth alternative embodiment of the present invention.

FIG. 32 shows a circuit which resets the plate lines PL in response to the power on reset signal PWRON. Such a configuration also makes it possible to eliminate the need for the erroneous programming circuit 14 provided for each plate line, at least as far as the plate lines are concerned.

The Transponder Circuit and the FRAM Card

Next, FIG. 33 shows an RFID (radio frequency identification) system utilizing a ferroelectric memory according to the present invention. An RFID system is a non-contact tag or identification system utilizing a radio or other electrical wave to form a non-contact data carrier system or the like. An overall configuration of such a system is shown in FIG. 34. This system is constituted by a host consisting of a personal computer, a controller, an antenna, etc., and a data carrier that functions as a transponder.

Figure 33A:
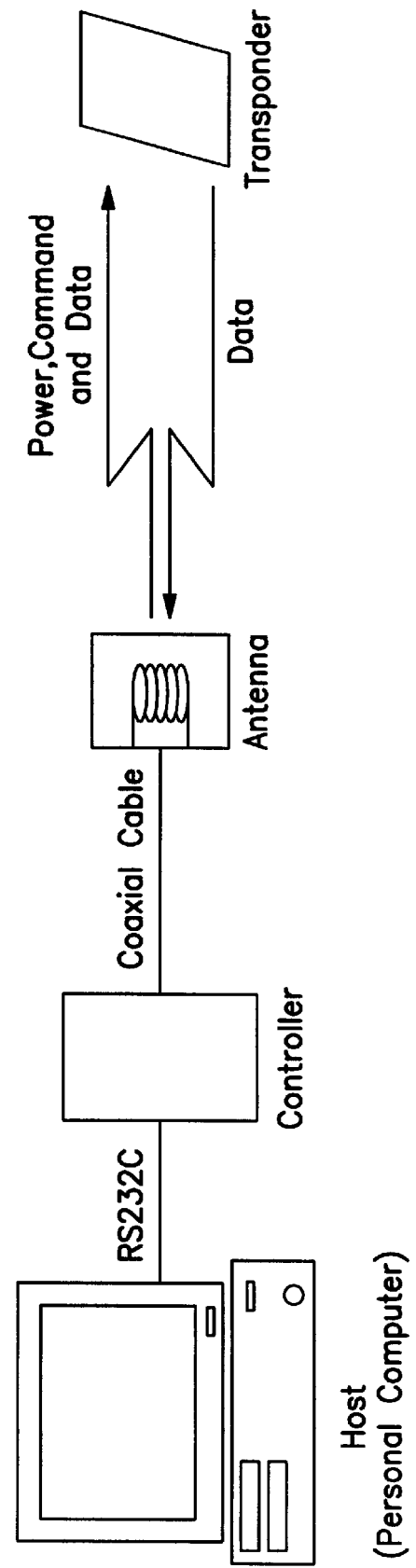
FIGS. 33A–33C illustrate a configuration of a transponder system which employs a ferroelectric memory according to the present invention.
Figure 34:
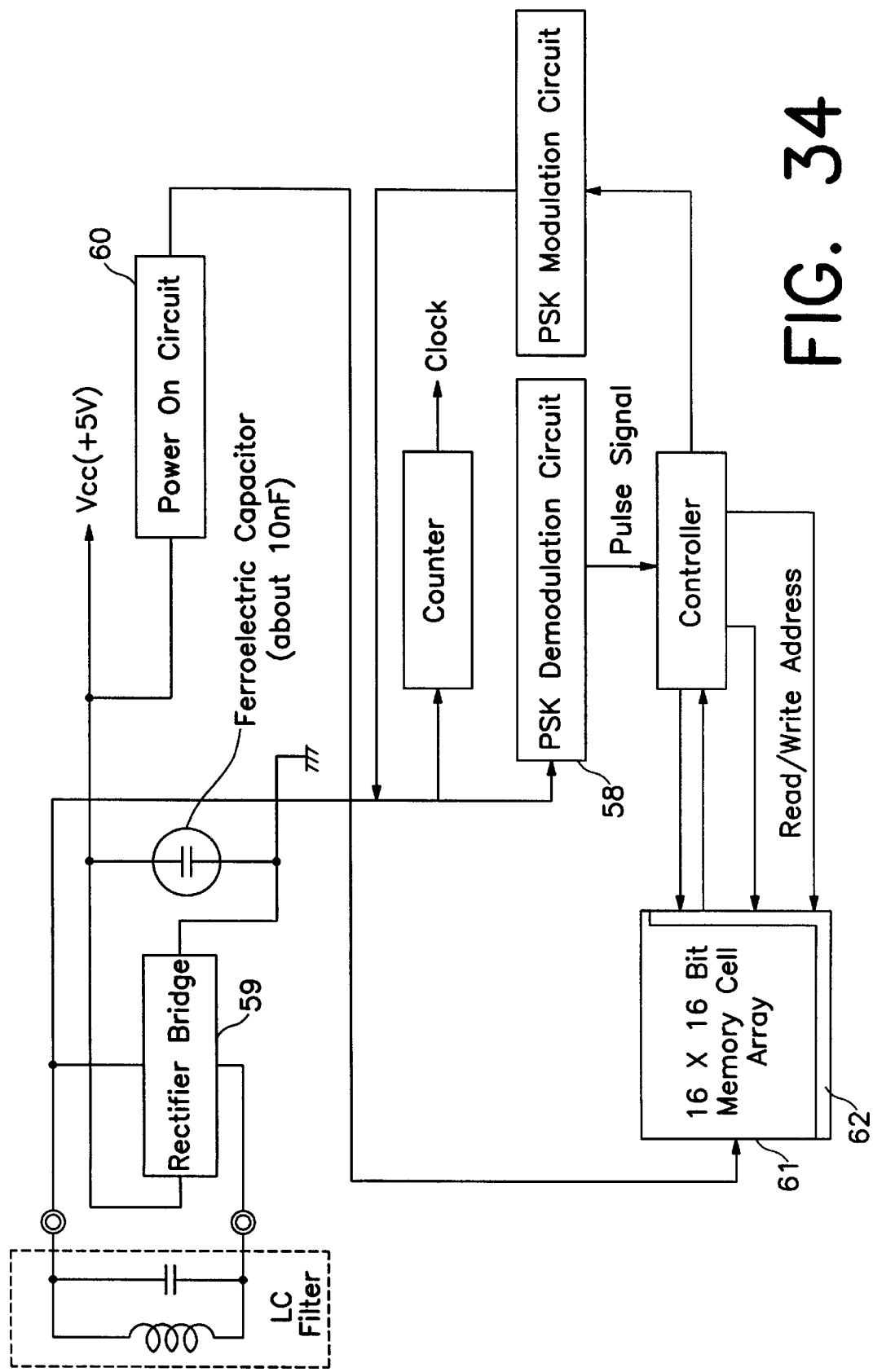
FIG. 34 illustrates internal circuits of the transponder in detail.

Referring to FIG. 33A, a practical application of the RFID system includes a host computer which controls monitoring functions, data logging, data analysis and data updating functions. In a typical installation, the host computer may be a personal computer and may have a connection to a remotely located central computer facility. Typically, the host computer is connected through a modem, RS232C or other interface to a controller and an antenna system. The antenna system may constantly broadcast a detection signal and constantly monitor for a signal output by a transponder. As such, the task of monitoring for recognizable signals output by transponders may be performed entirely within the controller and antenna, with data being transmitted to the host computer only when a valid data signature has been detected. Alternatively, the host computer may initiate regular interrogations through a connected antenna system to determine if any RFID transponders are within a detectable range. Upon detecting the presence of an RFID transponder, data identifying the transponder is provided to the host computer system for analysis.

The host computer system may, for example, check an identification number or signal with a database of valid identification numbers. In other applications, the host computer may check an identification number to determine if a transponder is currently valid or if the transponder is registered for use of the host computer's services. If the transponder is valid or registered, the host computer would then process a second portion of data provided by the transponder data. This second data portion might be an account balance if the transponder is being used as a transaction card, debit card or credit card. In other cases, the second data portion might signify a card value, such as when the card includes information about prepayment of, for example, subway fares or parking charges. For systems in which a second data portion is provided by the transponder, the host computer will verify the information in whatever manner is desired, will adjust the value of the second data portion, and transmit the adjusted data portion back to the transponder where the data will be stored within the ferroelectric memory. When the transponder is used for a subway card, for example, the host computer will first determine that the transponder is beginning a trip and then will transmit to the transponder a signal identifying the beginning location of the trip. After the trip is completed, a second host computer (or a remotely located terminal of the first host computer) will determine that the transponder has completed at least a portion of a trip and the computer will debit the appropriate fare from the second data portion and return the adjusted value to the transponder.

Figure 33B:
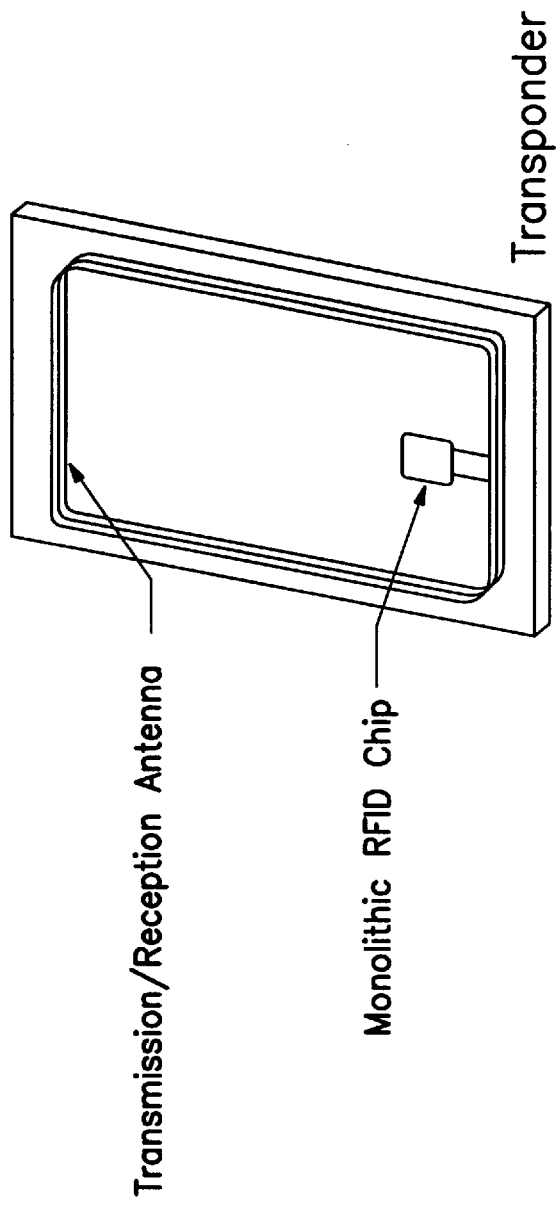

The host computer transmits commands and data on a carrier wave as needed, and the transponder generates required power from the carrier wave, uses the power for the writing, reading and transmission of data, and returns information to the host. As shown in FIG. 33B, the transponder preferably includes an antenna which performs both of the reception of power and data reception/transmission.

Although other data communications techniques, including optical, could be used for the transponder, the radio frequency application is particularly preferred because it is possible to operate the transponder without reliance on batteries. In the operation of this embodiment, the transponder is placed sufficiently close to the antenna of the host system so that an alternating electric field generated by the host antenna is received by the antenna within the transponder. The alternating electric field from the host antenna in turn generates a field within the transponder antenna of sufficient strength to generate a potential across the ends of the transponder antenna. Circuitry within the transponder converts the received electromagnetic signal into a power supply signal of sufficient energy to power the data processing and communications functions of the processor.

Figure 33C:
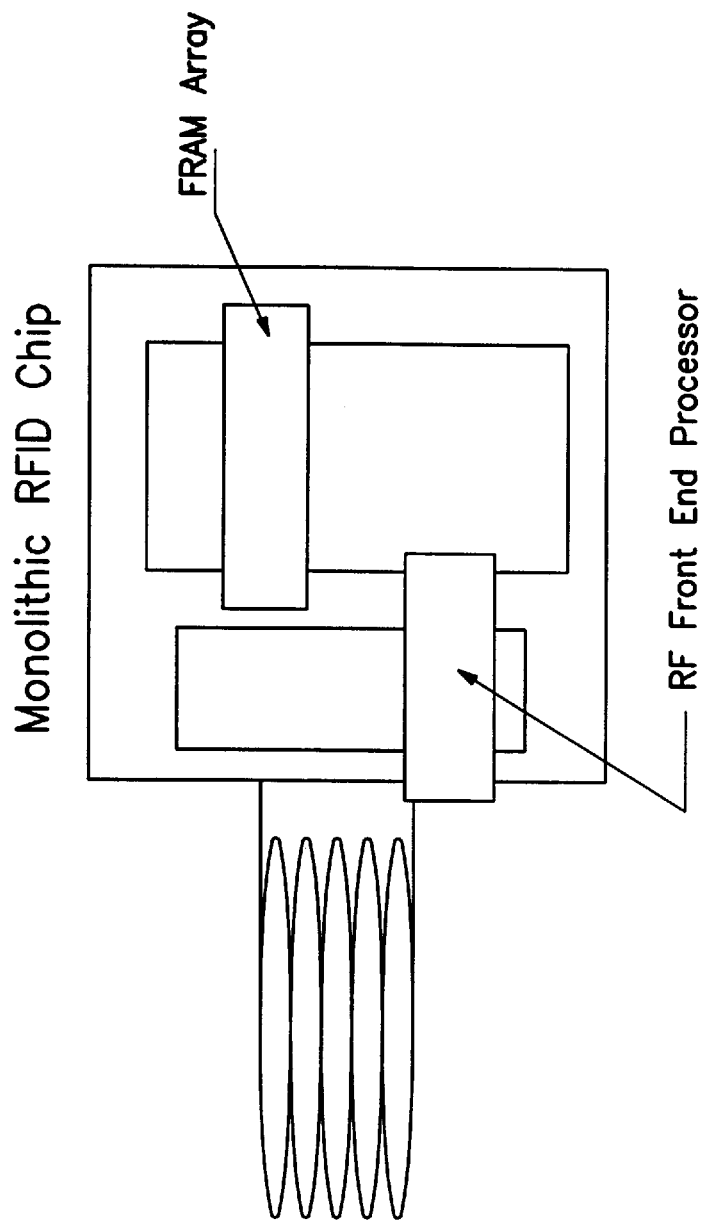

The transponder illustrated in FIG. 33C has a simple configuration including a monolithic RFID chip having a ferroelectric memory and an ASIC providing "front end" processing functions. Typically, the front end processing functions embodied in the ASIC relate to the addressing, retrieval, formatting, and storage of information within ferroelectric memory.

A non-contact tag is a system which reads the contents of a memory on a non-contact basis preferably using an electrical wave, preferably without the need for a battery, and rewrites the contents of the memory. The non-contact tag may be used for purposes such as monitoring of people moving in and out of a certain place. Possible applications of such a tag include ticket examination (or entrance fee collection) wherein a season ticket utilizing such a tag can be examined without the need for taking it out from a person's pocket. Toll adjustment on a highway may be accomplished without requiring that a user stop at a tollgate if such a tag is attached to his or her car. Such a system might also be used for the unmanned monitoring and management of a parking facility. Further, such a tag can be used for management of farm animals and wandering fishes.

FIG. 34 illustrates the internal circuits of an embodiment of transponder. The transponder has an LC filter coupled to its antenna for detecting an electromagnetic wave from an external source. Other circuitry might be used for coupling a signal from a host computer into the transponder, but the combination of an antenna and an LC filter is particularly preferred for its simplicity and the ease with which both power and data signals can be derived. One output from the LC filter is provided to a counter circuit which generates an internal clock signal for the transponder as well as to a phase-shift keying (PSK) demodulation circuit. Other compact, reliable demodulation circuits embodying different modulation schemes might also be used. PSK demodulation circuit 58 demodulates the signal derived by the LC filter from the electromagnetic wave, and provides the signal to a memory controller. The signal provided by the PSK demodulation circuit to the memory controller may be a digital bit stream having a command field, an address field and a data field. Typically, the command field will specify whether a read or a write operation is to be performed and the address field will specify the address into which data will be written or read. The data field will either provide the data to be written into the memory or it will receive the data provided by the memory. Data read from the memory are provided to the PSK modulation circuit, which modulates the data into a signal for transmission over the transponder antenna, and provides the signal to the LC filter.

Circuit 59 is connected across the LC filter and generates a power supply voltage from the electromagnetic wave detected by the LC filter. A power on circuit 60 outputs a power on reset signal upon detection of the rise of the power supply voltage from circuit 59.

Memory cell array 61 comprises a plurality of memory cells arranged in the form of a matrix, with each cell consisting of a capacitor having a ferroelectric material between its electrodes and a MOS transistor for transferring electrical charges between the capacitor and a bit line. Within the ferroelectric memory array 61, each MOS transistor for memory cells within the same row is connected to the same word line. One of the electrodes of each capacitor of the memory cells belonging to the same row is connected in common to the same plate line, and one of the terminals of each MOS transistor of the memory cells belonging to the same row is connected in common to the same bit line.

A reset circuit 62 for setting each of the plate electrode lines and word lines or bit lines at the same potential in response to the power on reset signal is provided within the peripheral circuitry of the memory cell array 61. The above-described configuration eliminates the possibility of erroneous data writing into the FRAM cell during the operation of the transponder system. As such, use of one of the embodiments of the FIG. 8 FRAM discussed within this specification represents a particularly preferred embodiment of the present invention.

As described above, a ferroelectric memory according to the present invention prevents a power on reset signal generated by a power on reset circuit from causing inversion of the polarization of ferroelectric memory cells, thereby preventing corruption of the data stored therein.

While the invention has been particularly shown and described with reference to preferred embodiments, it will be understood by those skilled in the art that various changed in form and detail may be made therein without departing from the spirit and scope of the invention.

What is claimed is:

1. A ferroelectric memory card comprising:

an LC filter for detecting an electromagnetic wave from a source external to the card;

a circuit for generating a signal from the electromagnetic wave detected by said LC filter;

a circuit for generating a power supply voltage from the electromagnetic wave detected by said LC filter;

a power on circuit for outputting a power on reset signal upon detection of said power supply voltage being at an operational level;

a memory cell array having a plurality of memory cells arranged in a matrix, each cell consisting of a capacitor having a ferroelectric material between electrodes thereof and a MOS transistor for transferring electrical charges, each MOS transistor within the memory cells belonging to a row being commonly connected by one word line, one of the electrodes of each capacitor within the memory cells belonging to a row being commonly connected by a plate line, one terminal of each MOS transistor of the memory cells belonging to a row being commonly connected by a bit line; and a reset circuit for setting each of said plate lines and said word lines at a first potential in response to said power on reset signal.

2. A memory system constituted by a transmitter for transmitting program data which has been converted into an electromagnetic wave of a predetermined frequency and a ferroelectric memory card for receiving said electromagnetic wave to store said program data, said ferroelectric memory card comprising:

an LC filter for detecting the electromagnetic wave from a source external to the card;

a circuit for generating a signal from the electromagnetic wave detected by said LC filter;

a circuit for generating a power supply voltage from the electromagnetic wave detected by said LC filter;

a power on circuit for outputting a power on reset signal upon detection of said power supply voltage being at an operational level;

a memory cell array having a plurality of memory cells arranged in a matrix, each cell consisting of a capacitor having a ferroelectric material between electrodes thereof and a MOS transistor for transferring electrical charges, each MOS transistor within the memory cells belonging to a row being commonly connected by one word line, one of the electrodes of each capacitor within the memory cells belonging to a row being commonly connected by a plate line, one terminal of each MOS transistor of the memory cells belonging to a row being commonly connected by a bit line; and a reset circuit for setting each of a plurality of plate lines and a plurality of word lines or a plurality of bit lines to a single potential in response to said power on reset signal.

3. A ferroelectric memory card comprising:

detector circuit for detecting an electromagnetic wave from a source external to the card;

a circuit for generating a signal from the electromagnetic wave detected by said detector circuit;

a power on circuit for outputting a power on reset signal upon detection of an operational power supply level;

a memory cell array having a plurality of memory cells arranged in a matrix, each cell consisting of a capacitor having a ferroelectric material between electrodes thereof and a MOS transistor for transferring electrical charges, each MOS transistor within the memory cells belonging to a row being commonly connected by one word line, one of the electrodes of each capacitor within the memory cells belonging to a row being commonly connected by a plate line, one terminal of each MOS transistor of the memory cells belonging to a row being commonly connected by a bit line; and a reset circuit for setting each of a plurality of plate lines and a plurality of word lines or a plurality of bit lines to a single potential in response to said power on reset signal.

4. The ferroelectric memory card of claim 3 further comprising a circuit for generating a power supply voltage from the electromagnetic wave detected by said detector circuit.

5. A ferroelectric memory card comprising:

detector circuit for detecting an electromagnetic wave from a source external to the card;

a circuit for generating a signal from the electromagnetic wave detected by said detector circuit;

a power on circuit for outputting a signal indicative of the presence of an operational power supply level; and a memory cell array having a plurality of memory cells arranged in a matrix, each cell consisting of a capacitor having a ferroelectric material between electrodes thereof and a MOS transistor for transferring electrical charges, each MOS transistor within the memory cells belonging to a row being commonly connected by one word line, one of the electrodes of each capacitor within the memory cells belonging to a row being commonly connected by a plate line, one terminal of each MOS transistor of the memory cells belonging to a row being commonly connected by a bit line.

* * * * *